US012598767B2

(12) United States Patent
Huang et al.

(10) Patent No.: US 12,598,767 B2
(45) Date of Patent: Apr. 7, 2026

(54) DIELECTRIC LAYERS FOR SEMICONDUCTOR DEVICES AND METHODS OF FORMING THE SAME

(71) Applicant: Taiwan Semiconductor Manufacturing Co., Ltd., Hsinchu (TW)

(72) Inventors: Yu-Lien Huang, Jhubei City (TW); Tze-Liang Lee, Hsinchu (TW); Jr-Hung Li, Chupei City (TW); Chi-Hao Chang, Taoyuan (TW); Hao-Yu Chang, Taipei City (TW); Pei-Yu Chou, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 778 days.

(21) Appl. No.: 17/841,493

(22) Filed: Jun. 15, 2022

(65) Prior Publication Data

US 2023/0282750 A1     Sep. 7, 2023

Related U.S. Application Data

(60) Provisional application No. 63/268,873, filed on Mar. 4, 2022.

(51) Int. Cl.
*H10D 30/62* (2025.01)
*H10D 30/01* (2025.01)

(52) U.S. Cl.
CPC ....... *H10D 30/6211* (2025.01); *H10D 30/024* (2025.01)

(58) Field of Classification Search
CPC ........................ H10D 30/6211; H10D 30/024
See application file for complete search history.

(56) References Cited

U.S. PATENT DOCUMENTS

| | | | |
|---|---|---|---|
| 11,024,540 B2 * | 6/2021 | Suen .................... | H10D 30/024 |
| 11,152,506 B1 * | 10/2021 | Chuang ................ | H10D 62/157 |
| 11,398,385 B2 | 7/2022 | Huang et al. | |

(Continued)

FOREIGN PATENT DOCUMENTS

KR        20210137363 A     11/2021

*Primary Examiner* — Nathan W Ha
(74) *Attorney, Agent, or Firm* — Slater Matsil, LLP

(57)        ABSTRACT

Methods of forming improved dielectric layers and semiconductor devices formed by the same are disclosed. In an embodiment, a semiconductor device includes a transistor structure on a semiconductor substrate; a first dielectric layer on the transistor structure; a second dielectric layer on the first dielectric layer, the second dielectric layer having a nitrogen concentration greater than a nitrogen concentration of the first dielectric layer; a first conductive structure extending through the second dielectric layer and the first dielectric layer, the first conductive structure being electrically coupled to a first source/drain region of the transistor structure, a top surface of the first conductive structure being level with a top surface of the second dielectric layer; and a second conductive structure physically and electrically coupled to the first conductive structure, a bottom surface of the second conductive structure being a first distance below the top surface of the second dielectric layer.

20 Claims, 22 Drawing Sheets

(56)                        References Cited

U.S. PATENT DOCUMENTS

| | | | | |
|---|---|---|---|---|
| 2006/0131672 | A1* | 6/2006 | Wang ................... | H10D 84/038 |
| | | | | 257/E21.639 |
| 2015/0372120 | A1 | 12/2015 | Ching et al. | |
| 2018/0061770 | A1* | 3/2018 | Yang ................. | H01L 21/76826 |
| 2020/0006065 | A1 | 1/2020 | Kao et al. | |
| 2020/0135553 | A1 | 4/2020 | Chen et al. | |
| 2021/0036127 | A1* | 2/2021 | Lin ...................... | H10D 64/017 |
| 2021/0098608 | A1* | 4/2021 | Zhou ................. | H10D 84/0147 |
| 2021/0225692 | A1 | 7/2021 | Peng | |
| 2021/0225762 | A1 | 7/2021 | Abhijith et al. | |
| 2021/0233805 | A1 | 7/2021 | Chen et al. | |
| 2021/0351039 | A1 | 11/2021 | Huang et al. | |
| 2021/0376105 | A1 | 12/2021 | Lin et al. | |
| 2021/0391339 | A1* | 12/2021 | Hung ................... | H10B 10/12 |
| 2022/0037510 | A1 | 2/2022 | Cheng | |

* cited by examiner

DIELECTRIC LAYERS FOR SEMICONDUCTOR DEVICES AND METHODS OF FORMING THE SAME

PRIORITY CLAIM AND CROSS-REFERENCE

This application claims the benefit of U.S. Provisional Application No. 63/268,873, filed on Mar. 4, 2022, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
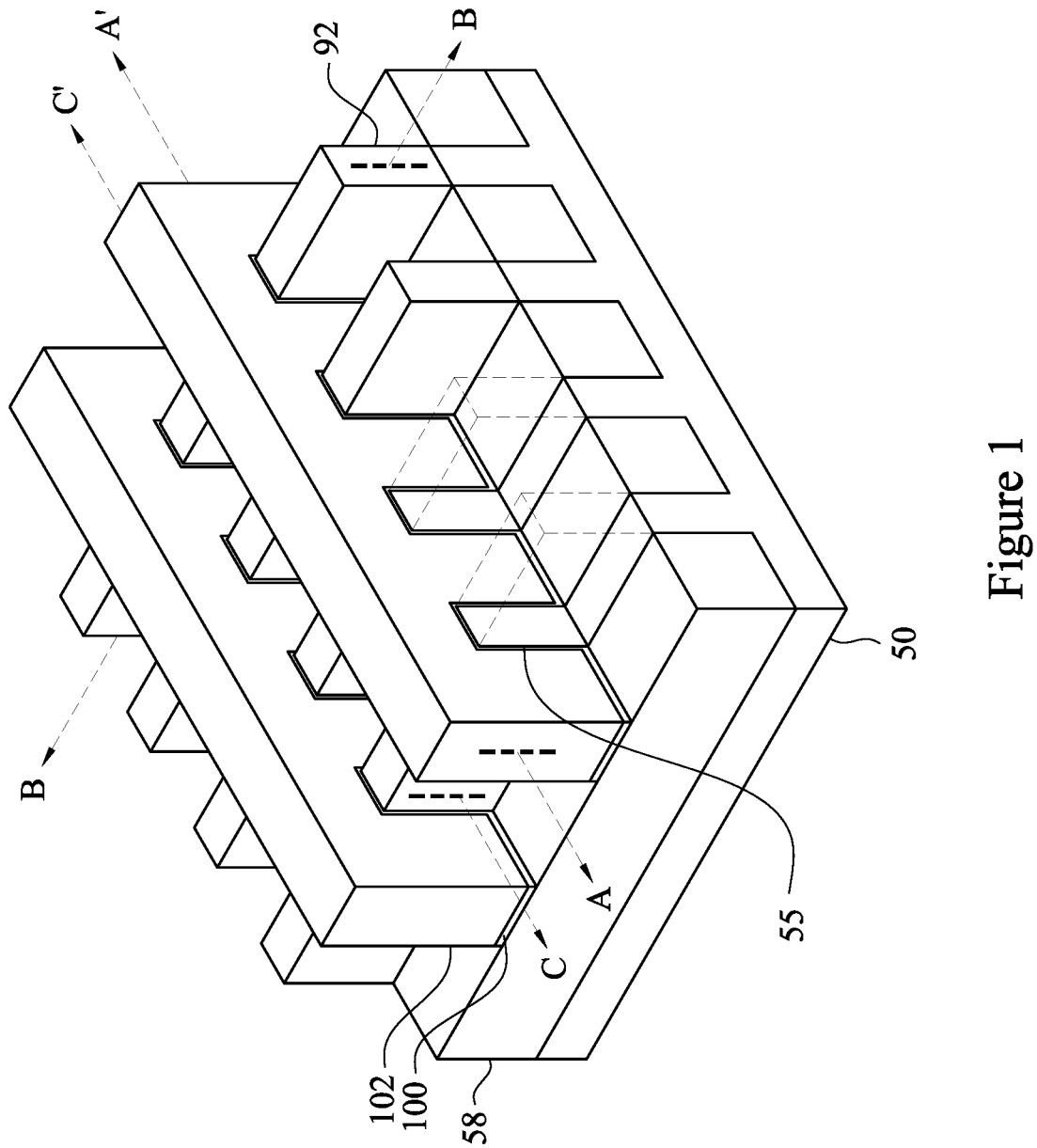
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for improving the etch resistance of dielectric layers and semiconductor devices formed by the same. The methods include forming dielectric layers, such as interlayer dielectrics (ILDs), inter-metal dielectrics (IMDs), or the like, and performing one or more nitridation or densification processes on the dielectric layers. In embodiments in which nitridation processes are performed, the nitridation processes may include exposing the dielectric layers to a nitrogen plasma or a nitrogen soak. Precursors for the nitridation processes may include nitrogen ($N_2$), ammonia ($NH_3$), combinations thereof, or the like. In embodiments in which densification processes are performed, the densification processes may include exposing the dielectric layers to a hydrogen plasma or exposing the dielectric layers to radiation, such as an ultraviolet (UV) treatment. Performing the nitridation or densification processes improves the etch resistance of the dielectric layers, which prevents damage to the dielectric layers by subsequent processes, prevents undesired materials from being deposited in the damaged dielectric layers, reduces the formation of shorts between contacts in the dielectric layers, and reduces device defects.

FIG. 1 illustrates an example of FinFETs in a three-dimensional view, in accordance with some embodiments. The FinFETs comprises fins 55 on a substrate 50 (e.g., a semiconductor substrate). Isolation regions 58 are disposed in the substrate 50, and the fins 55 protrude above and from between neighboring isolation regions 58. Although the isolation regions 58 are described/illustrated as being separate from the substrate 50, as used herein the term "substrate" may be used to refer to just the semiconductor substrate or a semiconductor substrate inclusive of isolation regions. Additionally, although the fins 55 are illustrated as single, continuous materials with the substrate 50, the fins 55 and/or the substrate 50 may comprise a single material or a plurality of materials. In this context, the fins 55 refer to the portions extending between the neighboring isolation regions 58.

Gate dielectric layers 100 are along sidewalls and over top surfaces of the fins 55, and gate electrodes 102 are over the gate dielectric layers 100. Source/drain regions 92 replace portions of the fins 55 on opposite sides of the fins 55 with respect to the gate dielectric layers 100 and the gate electrodes 102. Source/drain regions may refer to a source or a drain, individually or collectively, dependent upon the context. FIG. 1 further illustrates reference cross-sections that are used in later figures. Cross-section A-A' is along a longitudinal axis of a gate electrode 102 and in a direction, for example, perpendicular to the direction of current flow between the source/drain regions 92 of the FinFETs. Cross-section B-B' is perpendicular to cross-section A-A' and is along a longitudinal axis of a fin 55 and in a direction of, for example, a current flow between the source/drain regions 92 of the FinFETs. Cross-section C-C' is parallel to cross-section A-A' and extends through the source/drain regions 92 of the FinFETs. Subsequent figures refer to these reference cross-sections for clarity.

Some embodiments discussed herein are discussed in the context of FinFETs formed using a gate-last process. In other embodiments, a gate-first process may be used. Some embodiments contemplate aspects used in planar devices, such as planar FETs, nanostructure (e.g., nanosheet, nanowire, gate-all-around, nano-ribbon, or the like) field-effect transistors (nanostructure FETs), or the like.

FIGS. 2 through 23C are cross-sectional views of intermediate stages in the manufacturing of FinFETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, and 23A are illustrated along reference cross-section A-A' illustrated in FIG. 1. FIGS. 6B, 7B, 8B, 9B, 10B, 11B, 12B, 13B, 14B, 15B, 16B, 17B, 18B, 19B, 20B, 21B, 22B, and 23B are illustrated along reference cross-section B-B' illustrated in FIG. 1. FIGS. 7C, 8C, 8D, 9C, 10C, 11C, 12C, 13C, 14C, 15C, 16C, 17C, 18C, 19C, 20C, 21C, 22C, and 23C are illustrated along reference cross-section C-C' illustrated in FIG. 1.

Figure 2:
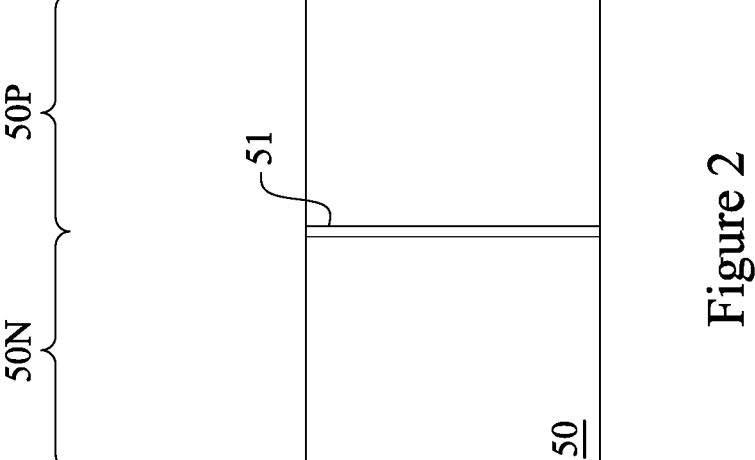

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type FinFETs. The p-type region 50P can be for forming p-type devices, such as PMOS transistors, e.g., p-type FinFETs. The n-type region 50N may be physically separated from the p-type region 50P (as illustrated by divider 51), and any number of device features (e.g., other active devices, doped regions, isolation structures, etc.) may be disposed between the n-type region 50N and the p-type region 50P.

Figure 3:
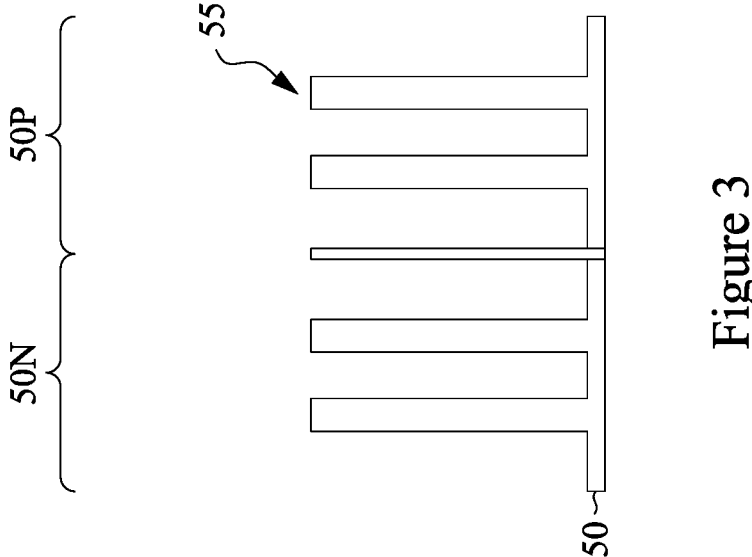
FIGS. 2, 3, 4, 5, 6A, 6B, 6C, 7A, 7B, 7C, 8A, 8B, 8C, 8D, 9A, 9B, 9C, 10A, 10B, 10C, 11A, 11B, 11C, 12A, 12B, 12C, 13A, 13B, 13C, 14A, 14B, 14C, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, and 23C are cross-sectional views of intermediate stages in the manufacturing of FinFETs, in accordance with some embodiments.

In FIG. 3, fins 55 are formed in the substrate 50. The fins 55 are semiconductor strips. In some embodiments, the fins 55 may be formed in the substrate 50 by etching trenches in the substrate 50. The etching may be any acceptable etch process, such as a reactive ion etch (RIE), neutral beam etch (NBE), the like, or a combination thereof. The etch may be anisotropic.

The fins 55 may be patterned by any suitable method. For example, the fins 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

For example, in some embodiments, a sacrificial layer is formed over a substrate and patterned using a photolithography process. Spacers are formed alongside the patterned sacrificial layer using a self-aligned process. The sacrificial layer is removed, and the remaining spacers may then be used to pattern the fins 55. In some embodiments, the mask (or other layer) may remain on the fins 55. As illustrated in FIG. 3, the fins 55 may have substantially straight, vertical sidewalls. In some embodiments, at least portions of the fins 55 may have tapered sidewalls, which taper (e.g., narrow) in a direction away from the substrate 50.

Figure 4:
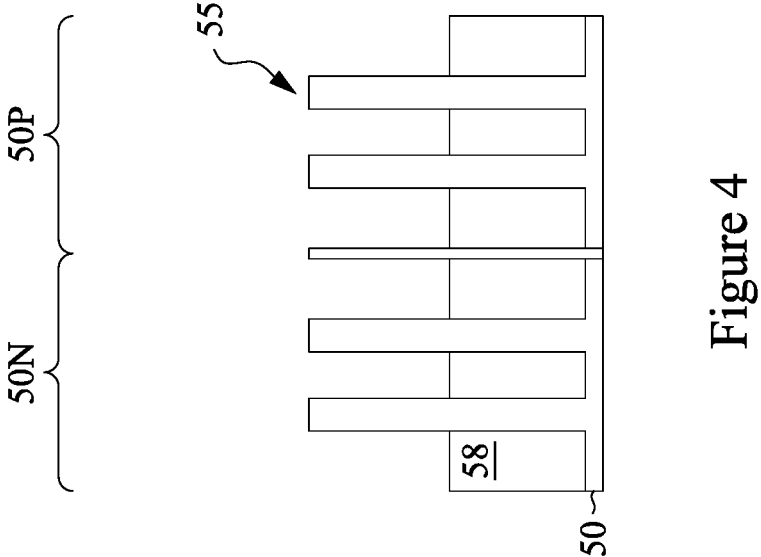

In FIG. 4, shallow trench isolation (STI) regions 58 are formed adjacent the fins 55. The STI regions 58 may be formed by forming an insulation material (not separately illustrated) over the substrate 50 and between neighboring fins 55. The insulation material may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system with post curing to convert the deposited material to another material, such as an oxide), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the fins 55. The insulation material may comprise a single layer or may utilize multiple layers. For example, in some embodiments a liner (not separately illustrated) may first be formed along surfaces of the substrate 50 and the fins 55. Thereafter, a fill material, such as those discussed above may be formed over the liner.

A removal process is then applied to the insulation material to remove excess insulation material over the fins 55. In some embodiments, a planarization process such as a chemical mechanical polish (CMP), an etch-back process, combinations thereof, or the like may be utilized. The planarization process may planarize the insulation material and the fins 55. The planarization process exposes the fins 55 such that top surfaces of the fins 55 and the insulation material are level after the planarization process is complete.

The insulation material is then recessed to form the STI regions 58 as illustrated in FIG. 4. The insulation material is recessed such that upper portions of the fins 55 and the substrate 50 protrude from between neighboring STI regions 58. Further, the top surfaces of the STI regions 58 may have flat surfaces as illustrated, convex surfaces, concave surfaces (such as dishing), or a combination thereof. The top surfaces of the STI regions 58 may be formed flat, convex, and/or concave by an appropriate etch. The STI regions 58 may be recessed using an acceptable etching process, such as one that is selective to the material of the insulation material (e.g., etches the material of the insulation material at a faster rate than the material of the fins 55 and the substrate 50). For example, an oxide removal using, for example, dilute hydrofluoric (dHF) acid may be used.

The process described with respect to FIGS. 2 through 4 is just one example of how the fins 55 may be formed. In some embodiments, the fins 55 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 55. For example, the fins 55 in FIG. 4 can be recessed, and a material different from the fins 55 may be epitaxially grown over the recessed fins 55. In such embodiments, the fins 55 comprise the recessed material as well as the epitaxially grown material disposed over the recessed material. In some embodiments, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 55. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in the n-type region 50N (e.g., an NMOS region) different from the material in the p-type region 50P (e.g., a PMOS region). In some embodiments, upper portions of the fins 55 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further in FIG. 4, appropriate wells (not separately illustrated) may be formed in the fins 55 and/or the substrate 50. In some embodiments, a P well may be formed in the n-type region 50N, and an N well may be formed in the p-type region 50P. In some embodiments, a P well or an N well are formed in both the n-type region 50N and the p-type region 50P.

In the embodiments with different well types, the different implant steps for the n-type region 50N and the p-type region 50P may be achieved using a photoresist or other masks (not separately illustrated). For example, a photoresist may be formed over the fins 55 and the STI regions 58 in the n-type region 50N. The photoresist is patterned to expose the p-type region 50P of the substrate 50, such as a PMOS region. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N, such as an NMOS region. The n-type impurities may be phosphorus, arsenic, antimony, or the like implanted in the region to a concentration of equal to or less than $1\times10^{18}$ atoms/cm³, such as between about $1\times10^{16}$ atoms/cm³ and about $1\times10^{18}$ atoms/cm³. After the implant, the photoresist is removed, such as by an acceptable ashing process.

Following the implanting of the p-type region 50P, a photoresist is formed over the fins 55 and the STI regions 58 in the p-type region 50P. The photoresist is patterned to expose the n-type region 50N of the substrate 50, such as the NMOS region. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P, such as the PMOS region. The p-type impurities may be boron, boron fluoride, indium, or the like implanted in the region to a concentration of equal to or less than $1\times10^{18}$ atoms/cm³, such as between about $1\times10^{16}$ atoms/cm³ and about $1\times10^{18}$ atoms/cm³. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
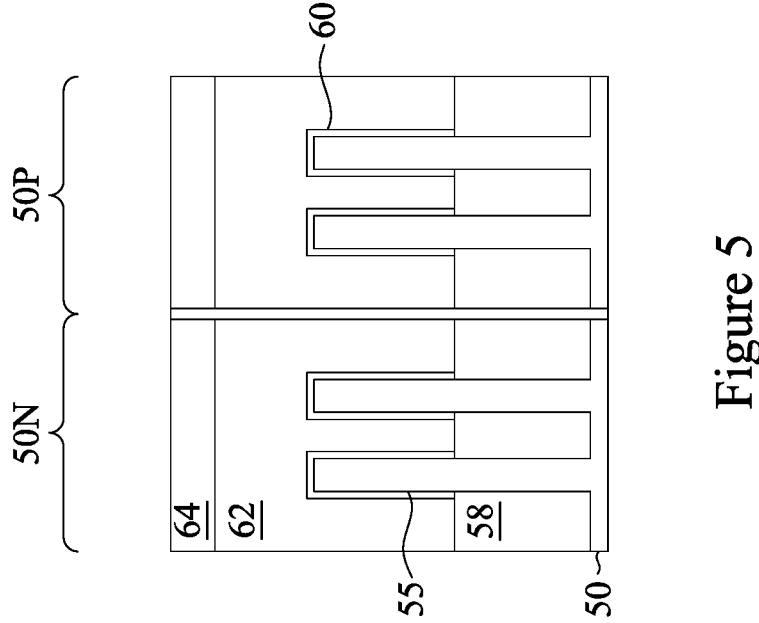

In FIG. 5, dummy dielectric layers 60 are formed on the fins 55. The dummy dielectric layers 60 may be, for example, silicon oxide, silicon nitride, a combination thereof, or the like, and may be deposited or thermally grown according to acceptable techniques. A dummy gate layer 62 is formed over the dummy dielectric layers 60, and a mask layer 64 is formed over the dummy gate layer 62. The dummy gate layer 62 may be deposited over the dummy dielectric layers 60 and then planarized by a process such as CMP. The mask layer 64 may be deposited over the dummy gate layer 62. The dummy gate layer 62 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 62 may be deposited by physical vapor deposition (PVD), CVD, sputter deposition, or other techniques for depositing the selected material. The dummy gate layer 62 may be made of other materials that have a high etching selectivity from the materials of the STI regions 58 and/or the dummy dielectric layers 60. The mask layer 64 may include one or more layers of, for example, silicon nitride, silicon oxynitride, or the like. In the embodiment illustrated in FIG. 5, a single dummy gate layer 62 and a single mask layer 64 are formed across the n-type region 50N and the p-type region 50P. It is noted that the dummy dielectric layers 60 are shown covering only the fins 55 for illustrative purposes only. In some embodiments, the dummy dielectric layers 60 may be deposited such that the dummy dielectric layers 60 cover the STI regions 58, extending between the dummy gate layer 62 and the STI regions 58.

FIGS. 6A through 23C illustrate various additional steps in the manufacturing of embodiment devices. FIGS. 6A through 23C illustrate features in either of the n-type region 50N and the p-type region 50P. For example, the structures illustrated in FIGS. 6A through 23C may be applicable to both the n-type region 50N and the p-type region 50P. Differences (if any) in the structures of the n-type region 50N and the p-type region 50P are described in the text accompanying each figure.

Figure 6C:
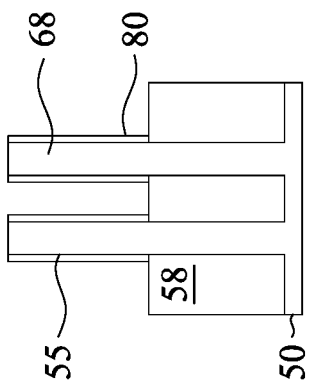
Figure 6B:
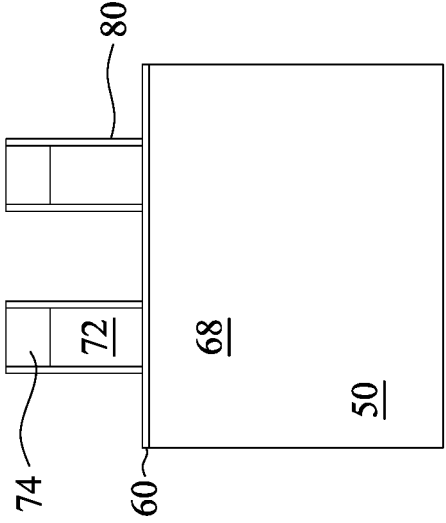
Figure 6A:
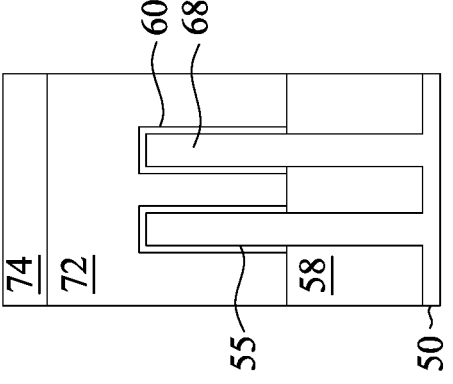

In FIGS. 6A through 6C, the mask layer 64 (see FIG. 5) may be patterned using acceptable photolithography and etching techniques to form masks 74. An acceptable etching technique may be used to transfer the pattern of the masks 74 to the dummy gate layer 62 to form dummy gates 72. In some embodiments (not separately illustrated), the pattern of the masks 74 may also be transferred to the dummy dielectric layers 60. The dummy gates 72 cover respective channel regions 68 of the fins 55. The pattern of the masks 74 may be used to physically separate each of the dummy gates 72 from adjacent dummy gates 72. The dummy gates 72 may each have a lengthwise direction substantially perpendicular to lengthwise directions of the fins 55. The dummy dielectric layers 60, the dummy gates 72, and the masks 74 may be collectively referred to as "dummy gate stacks" or "dummy gate structures."

Further in FIGS. 6A through 6C, gate seal spacers 80 may be formed on side surfaces of the dummy gates 72, the masks 74, and/or the fins 55. A thermal oxidation or a deposition followed by an anisotropic etch may form the gate seal spacers 80. The gate seal spacers 80 may be formed of silicon oxide, silicon nitride, silicon oxynitride, or the like.

After the formation of the gate seal spacers 80, implants for lightly doped source/drain (LDD) regions (not separately illustrated) may be performed. In embodiments with different device types, similar to the implants discussed above with respect to FIG. 4, a mask such as a photoresist, may be formed over the n-type region 50N, while exposing the p-type region 50P. Appropriate type (e.g., p-type) impurities may be implanted into the exposed fins 55 in the p-type region 50P. The mask may then be removed. A mask such as a photoresist, may be formed over the p-type region 50P while exposing the n-type region 50N. Appropriate type impurities (e.g., n-type) may be implanted into the exposed fins 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ atoms/cm$^3$ to about $10^{19}$ atoms/cm$^3$. An anneal may be used to repair implant damage and to activate the implanted impurities.

Figure 7C:
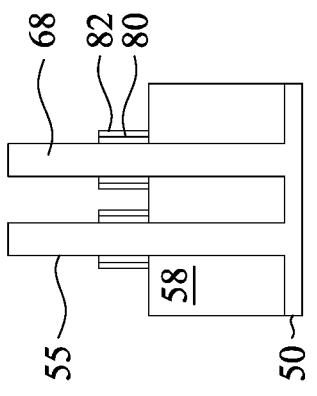
Figure 7B:
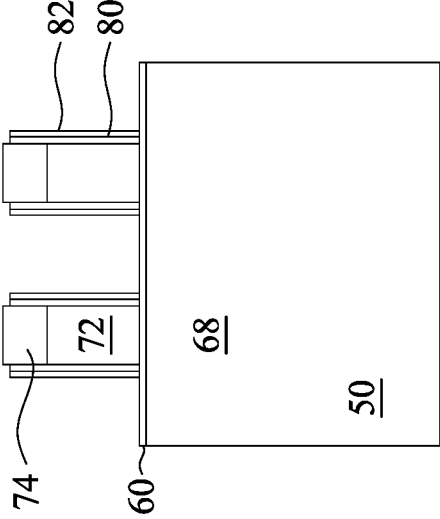
Figure 7A:
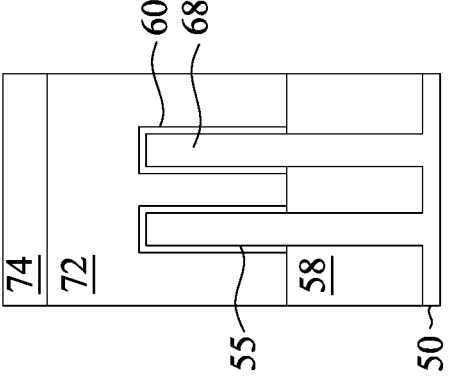

In FIGS. 7A through 7C, gate spacers 82 are formed on the gate seal spacers 80 along sidewalls of the dummy gates 72 and the masks 74. The gate spacers 82 may be formed by conformally depositing an insulating material and subsequently anisotropically etching the insulating material. The insulating material of the gate spacers 82 may be silicon oxide, silicon nitride, silicon oxynitride, silicon carbonitride, a combination thereof, or the like. The gate seal spacers 80 and the gate spacers 82 may have different heights adjacent the fins 55 and the dummy gate stacks due to the etching processes used to etch the gate seal spacers 80 and the gate spacers 82, as well as different heights between the fins 55 and the dummy gate stacks. Specifically, as illustrated in FIGS. 7B and 7C, in some embodiments, the gate seal spacers 80 and the gate spacers 82 may extend partially up sidewalls of the fins 55 and the dummy gate stacks. In some embodiments, the gate seal spacers 80 and the gate spacers 82 may extend to top surfaces of the dummy gate stacks and/or the fins 55.

It is noted that the above disclosure generally describes a process of forming spacers and LDD regions. Other processes and sequences may be used. For example, fewer or additional spacers may be utilized, different sequence of steps may be utilized (e.g., the gate seal spacers 80 may not be etched prior to forming the gate spacers 82, yielding "L-shaped" gate seal spacers; additional spacers may be formed and removed; and/or the like.) Furthermore, the devices in the n-type region 50N and the p-type region 50P may be formed using a different structures and steps. For example, LDD regions in the n-type region 50N may be formed prior to forming the gate seal spacers 80, while LDD regions in the p-type region 50P may be formed after forming the gate seal spacers 80.

In FIGS. 8A through 8D epitaxial source/drain regions 92 are formed in the fins 55. The epitaxial source/drain regions 92 are formed in the fins 55 such that each dummy gate 72 is disposed between respective neighboring pairs of the epitaxial source/drain regions 92. In some embodiments, the epitaxial source/drain regions 92 may extend into and/or may penetrate through the fins 55. In some embodiments, the gate spacers 82 are used to separate the epitaxial source/drain regions 92 from the dummy gates 72 by an appropriate lateral distance so that the epitaxial source/drain regions 92 do not short out subsequently formed gates of the resulting FinFETs. Materials of the epitaxial source/drain regions 92 may be selected to exert stress in the respective channel regions 68, thereby improving performance.

The epitaxial source/drain regions 92 in the n-type region 50N may be formed by masking the p-type region 50P and etching source/drain regions of the fins 55 in the n-type region 50N to form recesses in the fins 55. The epitaxial source/drain regions 92 are then epitaxially grown in the recesses in the n-type region 50N. The epitaxial source/drain regions 92 may include any acceptable materials, such as materials appropriate for forming source/drain regions in n-type FinFETs. For example, in embodiments in which the fins 55 comprise silicon, the epitaxial source/drain regions 92 in the n-type region 50N may include materials exerting a tensile strain in the channel region 68, such as silicon, silicon carbide, phosphorous-doped silicon carbide, silicon phosphide, or the like. The epitaxial source/drain regions 92 in the n-type region 50N may have surfaces raised from respective surfaces of the fins 55 and may have facets.

The epitaxial source/drain regions 92 in the p-type region 50P may be formed by masking the n-type region 50N and etching source/drain regions of the fins 55 in the p-type region 50P to form recesses in the fins 55. The epitaxial source/drain regions 92 are then epitaxially grown in the recesses in the p-type region 50P. The epitaxial source/drain regions 92 may include any acceptable materials, such as materials appropriate for forming source/drain regions in p-type FinFETs. For example, in embodiments in which the fins 55 comprise silicon, the epitaxial source/drain regions 92 in the p-type region 50P may comprise materials exerting a compressive strain in the channel region 68, such as silicon-germanium, boron-doped silicon-germanium, germanium, germanium tin, or the like. The epitaxial source/drain regions 92 in the p-type region 50P may have surfaces raised from respective surfaces of the fins 55 and may have facets.

The epitaxial source/drain regions 92 and/or the fins 55 may be implanted with dopants to form source/drain regions, similar to the process previously discussed for forming lightly-doped source/drain regions, followed by an anneal. The source/drain regions may have an impurity concentration of between about $10^{19}$ atoms/cm$^3$ and about $10^{21}$ atoms/cm$^3$. The n-type and/or p-type impurities for the source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the fins 55. In some embodiments, these facets cause adjacent epitaxial source/drain regions 92 of a same FinFET to merge, as illustrated by FIG. 8C. In some embodiments, adjacent epitaxial source/drain regions 92 remain separated after the epitaxy process is completed, as illustrated by FIG. 8D. In the embodiments illustrated in FIGS. 8C and 8D, the gate seal spacers 80 and the gate spacers 82 are formed covering portions of side surfaces of the fins 55 that extend above the STI regions 58 thereby blocking the epitaxial growth. In some embodiments, the spacer etches used to form the gate seal spacers 80 and the gate spacers 82 may be adjusted to remove the spacer materials, allowing the epitaxially grown regions to extend to the surface of the STI regions 58.

Figure 8B:
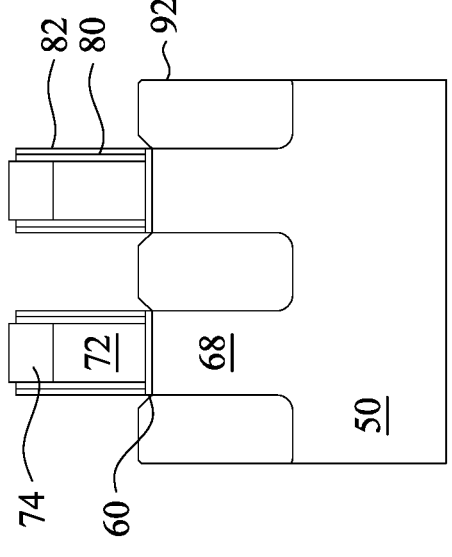
Figure 8A:
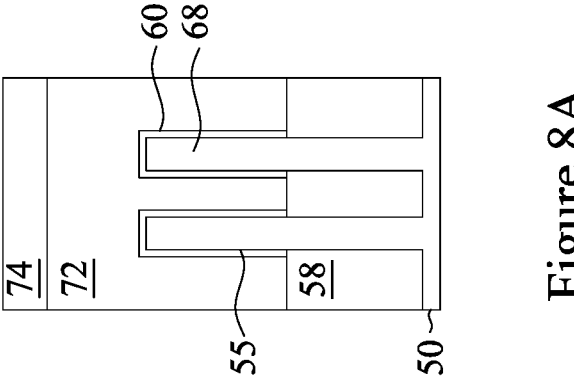
Figure 8D:
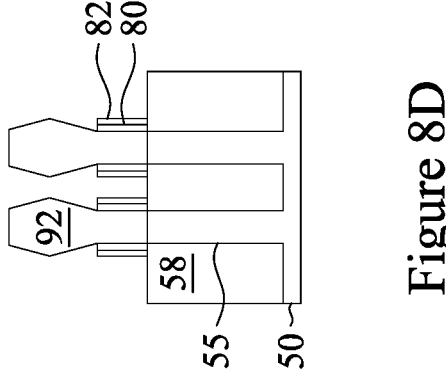
Figure 8C:
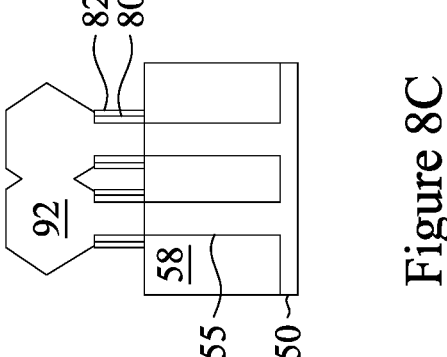
Figure 9C:
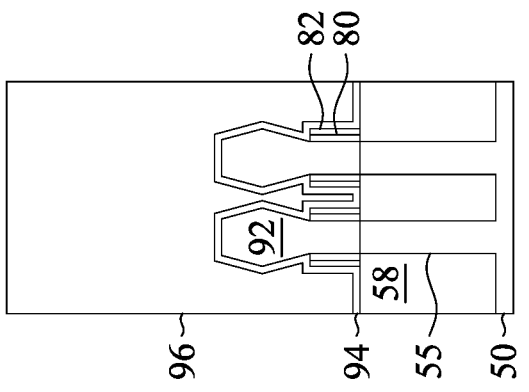
Figure 9B:
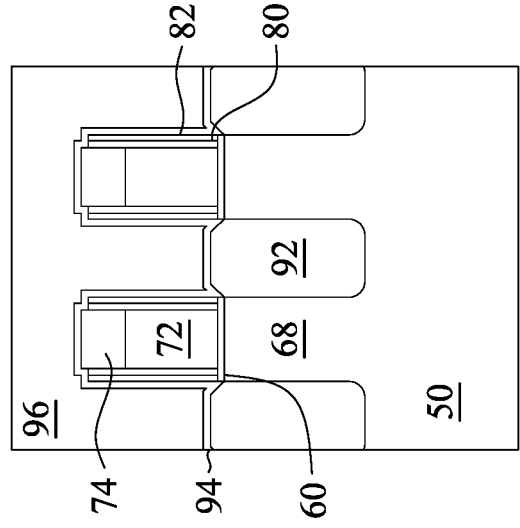
Figure 9A:
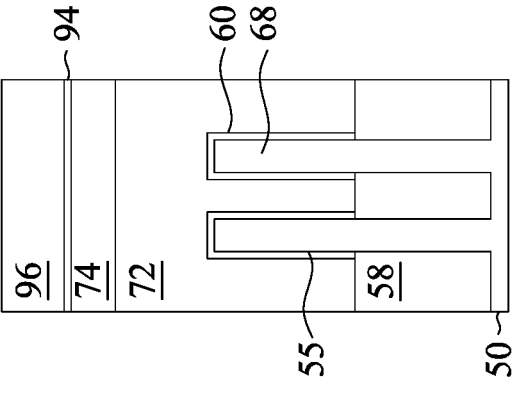

In FIGS. 9A through 9C, a first interlayer dielectric (ILD) 96 is deposited over the structure illustrated in FIGS. 8A, 8B, and 8D, respectively. The first ILD 96 may be referred to as ILD0. The first ILD 96 may be formed of a dielectric material, and may be deposited by any suitable method, such as CVD, plasma-enhanced CVD (PECVD), FCVD, or the like. Dielectric materials may include silicon oxide (SiO$_2$), phosphosilicate glass (PSG), borosilicate glass (BSG), boron-doped phosphosilicate glass (BPSG), un-doped silicate glass (USG), or the like. Other insulation materials formed by any acceptable process may be used. As will be discussed in detail below, a nitridation or densification process may be subsequently performed on the first ILD 96 to improve an etch resistance of the first ILD 96. Prior to the nitridation or densification process being performed, the first ILD 96 may have a nitrogen concentration of about 0 atomic percent (at. %), or less than about 2 at. % and a density in a range from about 2.1 g/cm$^3$ to about 2.2 g/cm$^3$. The first ILD 96 may have a hydrogen concentration of less than about 5 at. %. Performing the subsequent nitridation or densification process improves an etch resistance of the first ILD 96, reducing damage to the first ILD 96 by subsequent processing, and reducing device defects.

In some embodiments, a first contact etch stop layer (CESL) 94 is disposed between the first ILD 96 and the epitaxial source/drain regions 92, the masks 74, the gate seal spacers 80, the gate spacers 82, and the STI regions 58. The first CESL 94 may comprise a dielectric material, such as, silicon nitride (SiN), silicon oxynitride (SiON), silicon oxycarbide (SiOC), silicon oxygen carbon nitride (SiOCN), or the like. The first CESL 94 may be formed from a material having a lower etch rate than the material of the overlying first ILD 96.

Figure 10C:
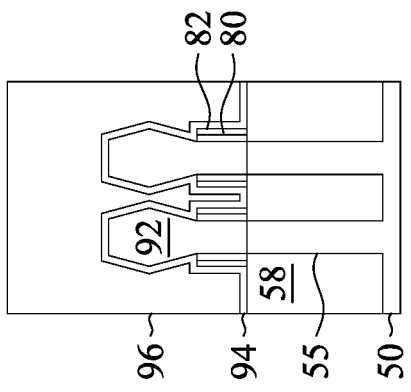
Figure 10B:
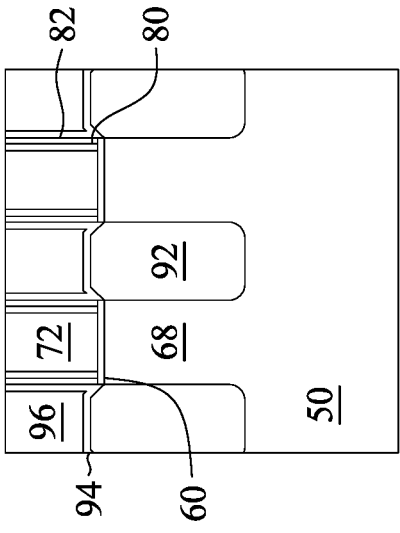
Figure 10A:
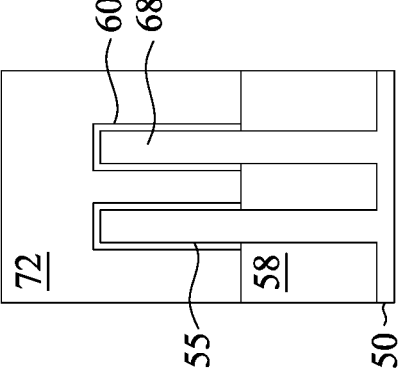

In FIGS. 10A through 10C, a planarization process, such as a CMP, may be performed to level the top surface of the first ILD 96 with the top surfaces of the dummy gates 72 or the masks 74. The planarization process may also remove the masks 74 on the dummy gates 72, and portions of the gate seal spacers 80 and the gate spacers 82 along sidewalls of the masks 74. After the planarization process, top surfaces of the dummy gates 72, the gate seal spacers 80, the gate spacers 82, the first ILD 96, and the first CESL 94 are level with one another, within process variations. Accordingly, the top surfaces of the dummy gates 72 are exposed through the first ILD 96 and the first CESL 94. In some embodiments, the masks 74 may remain, in which case the planarization process levels top surfaces of the first ILD 96 with top surfaces of the masks 74, the gate seal spacers 80, the gate spacers 82, and the first CESL 94.

Figure 11C:
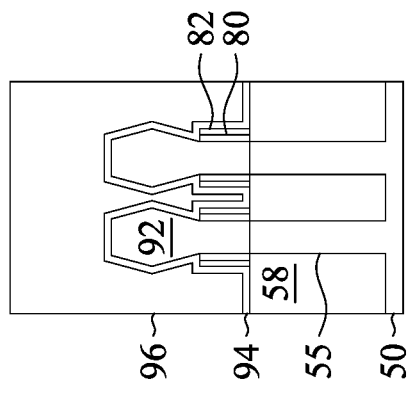
Figure 11B:
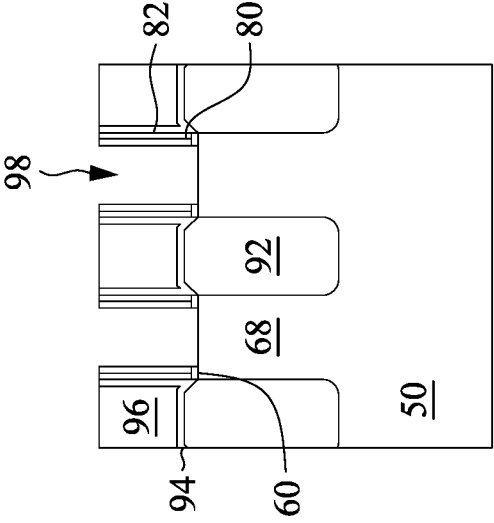
Figure 11A:
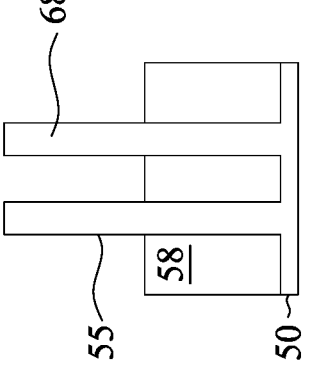

In FIGS. 11A through 11C, the dummy gates 72, and the masks 74 if present, are removed to form recesses 98. Portions of the dummy dielectric layers 60 below the dummy gates 72 may also be removed. In some embodiments, only the dummy gates 72 are removed and the dummy dielectric layers 60 remain and are exposed by the recesses 98. In some embodiments, the dummy dielectric layers 60 are removed from the recesses 98 in a first region of a die (e.g., a core logic region) and remain below the recesses 98 in a second region of the die (e.g., an input/output region). In some embodiments, the dummy gates 72 are removed by an anisotropic dry etching process. For example, the etching process may include a dry etch process using reaction gas(es) that selectively etch the dummy gates 72 with little or no etching of the first ILD 96, the first CESL 94, the gate spacers 82, or the gate seal spacers 80. Each of the recesses 98 exposes and/or overlies a channel region 68 of a respective fin 55. Each of the channel regions 68 is disposed between neighboring pairs of the epitaxial source/drain regions 92. During the removal, the dummy dielectric layers 60 may be used as an etch stop layer when the dummy gates 72 are etched. The dummy dielectric layers 60 may then be optionally removed after the removal of the dummy gates 72.

Figure 12C:
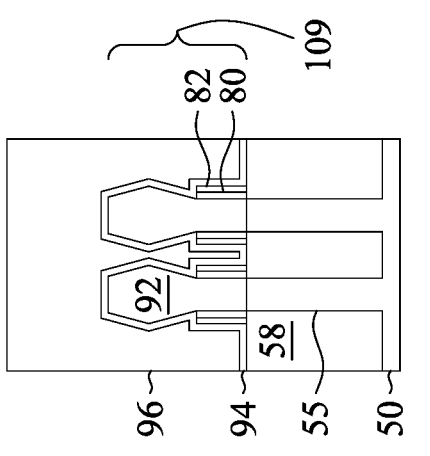
Figure 12B:
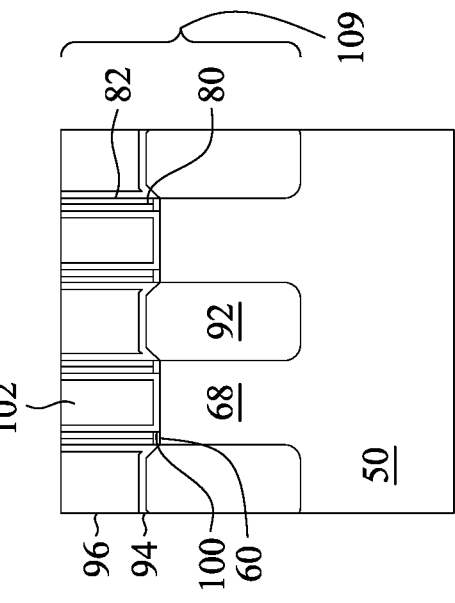
Figure 12A:
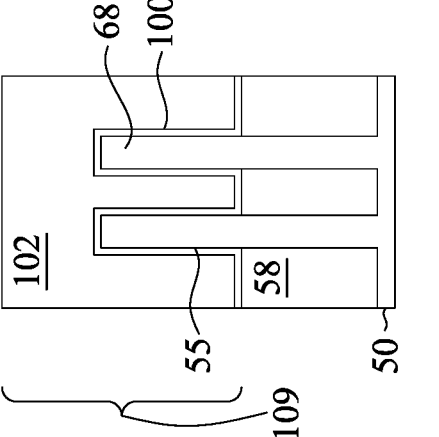

In FIGS. 12A through 12C, gate dielectric layers 100 and gate electrodes 102 are formed in the recesses 98 for replacement gates. The gate dielectric layers 100 comprise one or more dielectric layers, which are deposited in the recesses 98. The gate dielectric layers 100 may be deposited on top surfaces and side surfaces of the fins 55 and the gate seal spacers 80 and on top surfaces of the STI regions 58, the first ILD 96, the first CESL 94, and the gate spacers 82. In some embodiments, the gate dielectric layers 100 comprise one or more dielectric layers, such as one or more layers of silicon oxide, silicon nitride, metal oxides, metal silicates, or the like. For example, in some embodiments, the gate dielectric layers 100 include an interfacial layer of silicon oxide formed by thermal or chemical oxidation and an overlying high-k dielectric material, such as a metal oxide or a silicate of hafnium, aluminum, zirconium, lanthanum, manganese, barium, titanium, lead, and combinations thereof. The gate dielectric layers 100 may include a dielectric layer having a k-value greater than about 7.0. The formation methods of the gate dielectric layers 100 may include molecular-beam deposition (MBD), ALD, PECVD, and the like. In embodiments where portions of the dummy dielectric layers 60 remain below the recesses 98, the gate dielectric layers 100 may include a material of the dummy dielectric layers 60 (e.g., SiO$_2$).

The gate electrodes 102 are deposited over the gate dielectric layers 100 and fill remaining portions of the recesses 98. The gate electrodes 102 may include a metal-containing material such as titanium nitride, titanium oxide, tantalum nitride, tantalum carbide, cobalt, ruthenium, aluminum, tungsten, combinations or multiple layers thereof, or the like. Although a single layer gate electrode 102 is illustrated in FIG. 14B, the gate electrodes 102 may comprise any number of liner layers, work function tuning layers, and a fill material. After filling the recesses 98, a planarization process, such as a CMP, may be performed to remove excess portions of the gate dielectric layers 100 and the gate electrodes 102, such as portions over top surfaces of the first ILD 96. The remaining portions the gate electrodes 102 and the gate dielectric layers 100 form replacement gates of the resulting FinFETs. The gate electrodes 102 and the gate dielectric layers 100 may be collectively referred to as a "gate stack" or "gate structure." The gate stacks may extend along sidewalls of the channel regions 68 of the fins 55.

The formation of the gate dielectric layers 100 in the n-type region 50N and the p-type region 50P may occur simultaneously such that the gate dielectric layers 100 in each region are formed from the same materials. The formation of the gate electrodes 102 in the n-type region 50N and the p-type region 50P may occur simultaneously such that the gate electrodes 102 in each region are formed from the same materials. In some embodiments, the gate dielectric layers 100 in each region may be formed by distinct processes, such that the gate dielectric layers 100 may be different materials, and/or the gate electrodes 102 in each region may be formed by distinct processes, such that the gate electrodes 102 may be different materials. Various masking steps may be used to mask and expose appropriate regions when using distinct processes.

The epitaxial source/drain regions 92, the fins 55, and the gate structures (including the gate dielectric layers 100 and the gate electrodes 102) may collectively be referred to as transistor structures 109. Although the transistor structures 109 are described as including FinFETs, other embodiments may include transistor structures 109 with different types of transistors (e.g., planar FETs, nanostructure FETs, thin film transistors (TFTs), or the like).

Figure 13C:
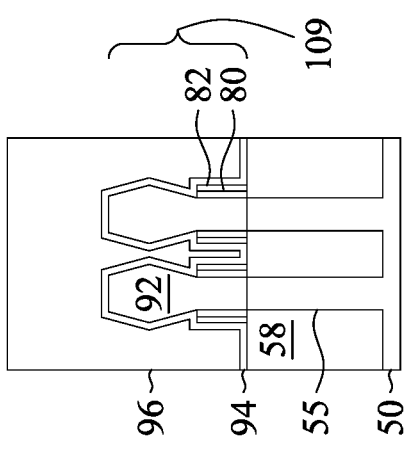
Figure 13B:
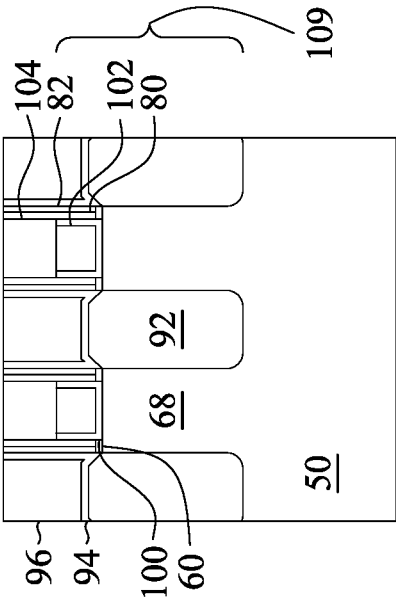
Figure 13A:
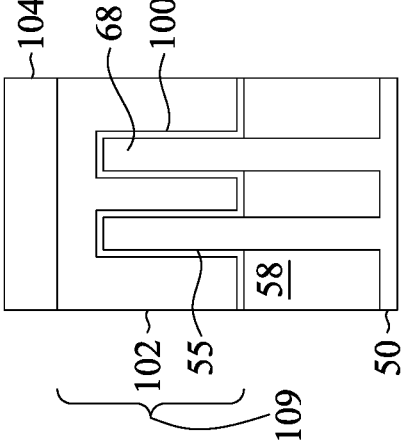

In FIGS. 13A through 13C, gate capping layers 104 are formed over the gate stack (including the gate dielectric layers 100 and the gate electrodes 102). The gate capping layers 104 may be disposed between opposing portions of the gate seal spacers 80. In some embodiments, forming the gate capping layers 104 includes recessing the gate stack so that a recess is formed directly over the gate stack and between opposing portions of the gate seal spacers 80. The gate capping layers 104, which comprise one or more layers of dielectric material, such as silicon nitride, silicon oxynitride, or the like, are filled in the recess. A planarization process is performed to remove excess portions of the dielectric materials, such as portions extending over the first ILD 96. The gate capping layers 104 are optional and may be omitted in some embodiments. In such embodiments, the gate stack may remain level with top surfaces of the first ILD 96.

Figure 14C:
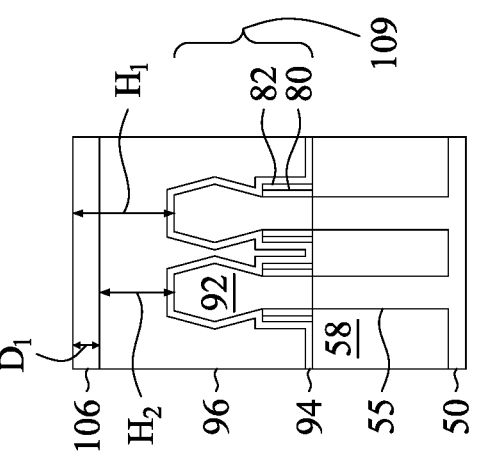
Figure 14B:
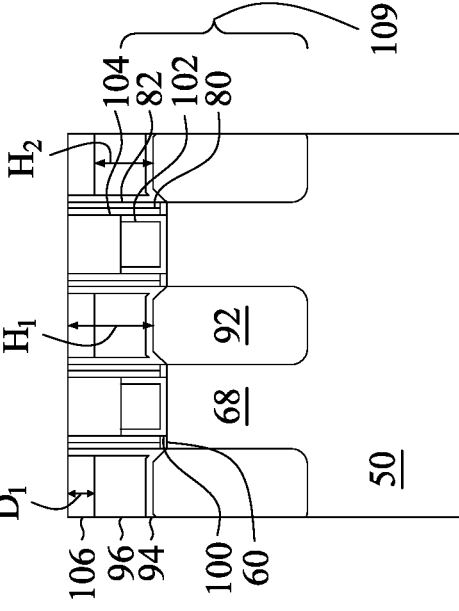
Figure 14A:
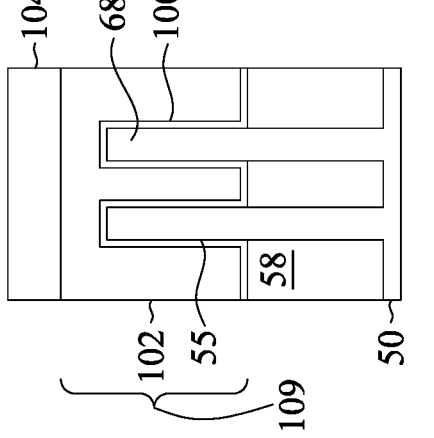

In FIGS. 14A through 14C, a nitridation process and/or a densification process is performed on the first ILD 96 to form a treated first ILD portion 106. Performing the nitridation process and/or the densification process on the first ILD 96 to form the treated first ILD portion 106 improves the etch resistance of the treated first ILD portion 106, which protects the treated first ILD portion 106 from damage caused by subsequent processing. For example, source/drain contacts (such as the first source/drain contacts 118, discussed below with respect to FIGS. 18A through 18C) may be subsequently formed in the treated first ILD portion 106 and the first ILD 96 and additional source/drain contacts (such as the second source/drain contacts 128, discussed below with respect to FIGS. 22A through 22C) may be subsequently formed over the treated first ILD portion 106. Forming the treated first ILD portion 106 reduces an etch rate of the treated first ILD portion 106 with respect to etchants used to form openings in which the source/drain contacts and additional source/drain contacts are formed, which reduces damage to the treated first ILD portion 106 and prevents materials of the source/drain contacts and additional source/drain contacts from being extruded into the treated first ILD portion 106 and the first ILD 96. This prevents shorts between adjacent source/drain contacts, and reduces device defects.

The nitridation process and/or the densification process may be performed on portions of the first ILD 96, such as upper portions of the first ILD 96. The nitridation process and/or the densification process may be performed on portions of the first ILD 96 that are more susceptible to damage by subsequent processing. Other portions of the first ILD 96, such as lower portions of the first ILD 96, may be unaffected by the nitridation process and/or the densification process.

This protects the epitaxial source/drain regions 92 and other structures underlying the first ILD 96 from damage caused by the nitridation process and/or the densification process.

Prior to performing the nitridation process and/or the densification process, the first ILD 96 may have a height $H_1$ over the epitaxial source/drain regions 92 in a range from about 10 nm to about 30 nm. In some embodiments, the treated first ILD portion 106 extends to a depth $D_1$ in a range from about 2 nm to about 15 nm. A ratio of the depth $D_1$ to the height $H_1$ may be in a range from about 0.07 to about 1. Portions of the first ILD 96 over the epitaxial source/drain regions 92 that are not treated by the nitridation process and/or the densification process have heights $H_2$ in a range from about 0 nm to about 28 nm. Providing the first ILD 96 and the treated first ILD portion 106 with the prescribed heights provides the benefits of the nitridation process and/or the densification process, without damaging structures underlying the first ILD 96, such as the epitaxial source/drain regions 92.

In embodiments in which a nitridation process is performed on the first ILD 96, the treated first ILD portion 106 may have a higher nitrogen concentration than portions the first ILD 96 that are un-treated by the nitridation process. The treated first ILD portion 106 may have a nitrogen concentration in a range from about 5 at. % to about 15 at. %. In some embodiments, the treated first ILD portion 106 may have a gradient nitrogen concentration. For example, a nitrogen concentration in the treated first ILD portion 106 may range from within a range from about 0 at. % to about 2 at. % at a boundary between the first ILD 96 and the treated first ILD portion 106 to within a range from about 5 at. % to about 15 at. % at a top surface of the treated first ILD portion 106. The nitridation process may also increase the density of the treated first ILD portion 106, such that the treated first ILD portion 106 has a density in a range from about 2.25 $g/cm^3$ to about 2.3 $g/cm^3$. Providing the treated first ILD portion 106 with the prescribed nitrogen concentrations provides the benefits of the nitridation process, without the nitridation process being performed to such an extent that underlying structures, such as the epitaxial source/drain regions 92, are damaged.

In embodiments in which the nitridation process is performed, the nitridation process may include a plasma nitridation process, a nitrogen gas soaking process, combinations thereof, or the like. The nitridation process may be performed at a temperature in a range from about 0° C. to about 400° C. and a pressure in a range from about 3 mTorr to about 10 Torr. In embodiments in which the plasma nitridation process is performed, an RF power in a range from about 50 W to about 2,000 W may be applied. In embodiments in which the nitrogen gas soaking process is performed, the first ILD 96 is exposed to a nitrogen-containing gas. An elevated temperature and/or overpressure may cause diffusion of nitrogen from the nitrogen-containing gas into the first ILD 96, thus forming the treated first ILD portion 106. Nitrogen for the plasma nitridation process and/or the nitrogen gas soaking process may be supplied by nitrogen-containing gases, such as nitrogen ($N_2$), ammonia ($NH_3$), combinations thereof, or the like. Nitrogen in the nitrogen-containing gases may react with hydrogen in the first ILD 96 to rearrange the first ILD 96, reducing the number of Si—H bonds in the treated first ILD portion 106, and increasing the number of Si—Si bonds, Si—O bonds, and Si—N bonds in the treated first ILD portion 106. This reduces interactions between the treated first ILD portion 106 and fluorine, which may be used in subsequent etch processes. The treated first ILD portion 106 may have a hydrogen concentration in a range from about 0 at. % to about 2 at. %.

In embodiments in which a densification process is performed on the first ILD 96, the treated first ILD portion 106 may have a higher density than portions the first ILD 96 that are un-treated by the densification process. The treated first ILD portion 106 may have density in a range from about 2.25 g/cm³ to about 2.3 g/cm³. A ratio of the density of the treated first ILD portion 106 to the density of the first ILD 96 may be in a range from about 1.02 to about 1.05. In some embodiments, the treated first ILD portion 106 may have a gradient density. For example, a density in the treated first ILD portion 106 may range from within a range from about 2.1 g/cm³ to about 2.2 g/cm³ at a boundary between the first ILD 96 and the treated first ILD portion 106 to within a range from about 2.25 g/cm³ to about 2.3 g/cm³ at a top surface of the treated first ILD portion 106. Providing the treated first ILD portion 106 with the prescribed densities provides the benefits of the densification process, without the densification process being performed to such an extent that underlying structures, such as the epitaxial source/drain regions 92, are damaged.

In embodiments in which the densification process is performed, the densification process may include a plasma process, a radiation process, combinations thereof, or the like. The densification process may be performed at a temperature in a range from about 0° C. to about 400° C. and a pressure in a range from about 3 mTorr to about 10 Torr. In embodiments in which the plasma process is performed, an RF power in a range from about 50 W to about 2,000 W may be applied. The plasma for the plasma process may be a hydrogen plasma or the like, which may be formed from hydrogen gas ($H_2$), argon gas (Ar), or the like. In embodiments in which the radiation process is performed, the first ILD 96 may be exposed to a UV treatment or the like. The densification process may break Si—H bonds in the first ILD 96 and rearrange the bonds in the first ILD 96 to form the treated first ILD portion 106 having an increased density. The densification process may rearrange the first ILD 96, reducing the number of Si—H bonds in the treated first ILD portion 106, and increasing the number of Si—Si bonds and Si—O bonds in the treated first ILD portion 106. This reduces interactions between the treated first ILD portion 106 and fluorine, which may be used in subsequent etch processes. The treated first ILD portion 106 may have a hydrogen concentration in a range from about 0 at. % to about 2 at. %.

In some embodiments, the nitridation process and/or the densification process may be a single process performed in a single processing step. In other embodiments, the nitridation process and/or the densification process may be a cyclic process, which includes multiple processing steps. For example, in some embodiments, the nitridation process and/or the densification process may include performing a first nitridation or densification process, depositing an etch stop layer over the first ILD 96, and performing a second nitridation or densification process. The etch stop layer may be the same as or similar to the first CESL 94. This process may be repeated any number of times, and may result in the treated first ILD portion 106 having an etch resistance that is even greater than the etch resistance resulting from a single-step nitridation process and/or densification process. However, performing a multi-step nitridation process and/or densification process increases costs and processing time.

Although the nitridation process and/or the densification process has been discussed as being performed after forming the gate capping layer 104, in some embodiments, the nitridation process and/or the densification process may be performed after forming the gate electrodes 102 and before etching back the gate electrodes 102, after removing the dummy gates 72 and before forming the gate electrodes 102, or after planarizing the first ILD 96 and before removing the dummy gates 72.

Figure 15C:
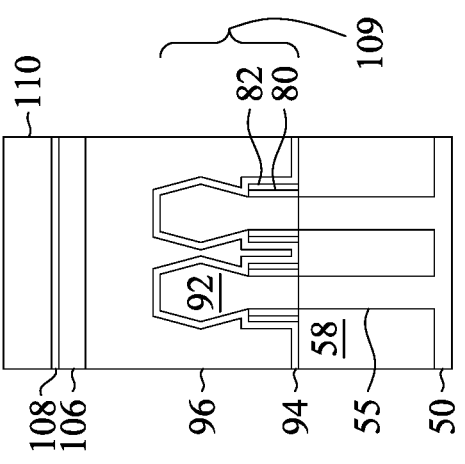
Figure 15B:
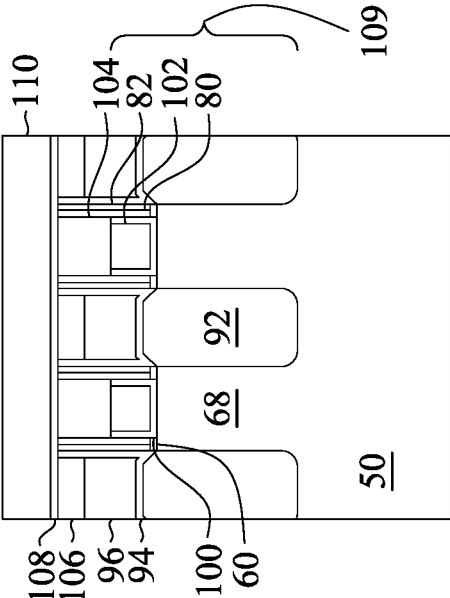
Figure 15A:
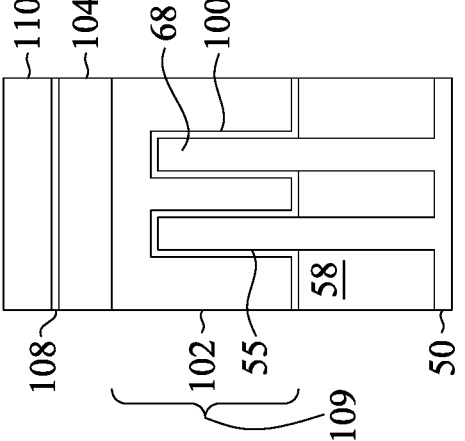

In FIGS. 15A through 15C, a second contact etch stop layer (CESL) 108 and a second interlayer dielectric (ILD) 110 are deposited over the structure illustrated in FIGS. 14A through 14C. The second ILD 110 may be referred to as ILD1. The second CESL 108 may be formed of materials and by processes the same as or similar to the first CESL 94. The second ILD 110 may be formed of materials and by processes the same as or similar to the first ILD 96.

Figure 16C:
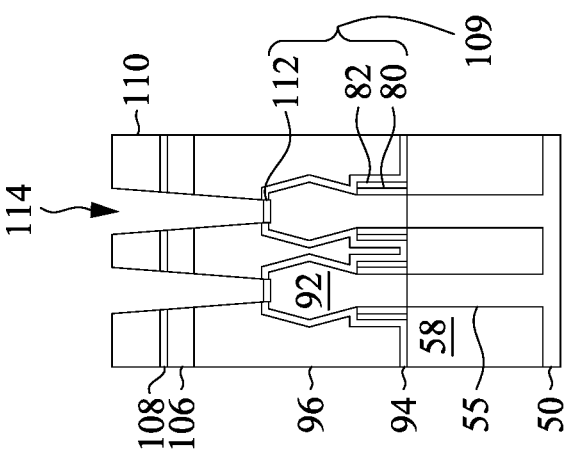
Figure 16B:
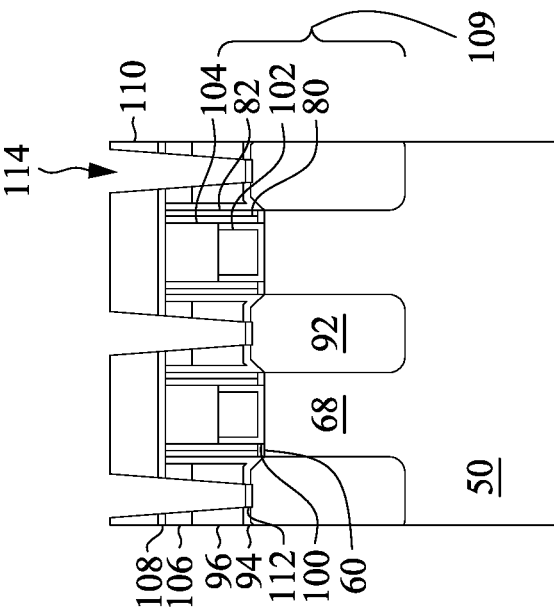
Figure 16A:
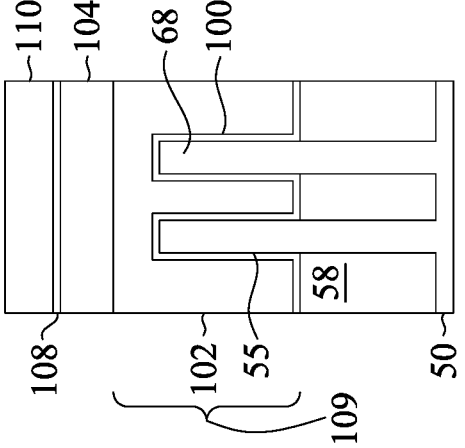

In FIGS. 16A through 16C, recesses 114 exposing the epitaxial source/drain regions 92 are formed and silicide regions 112 are formed in the recesses 114 over the epitaxial source/drain regions 92. The recesses 114 are formed extending through the second ILD 110, the second CESL 108, the treated first ILD portion 106, the first ILD 96, and the first CESL 94. The recesses 114 may be formed by etching using an anisotropic etching process, such as RIE, NBE, or the like. In some embodiments, the recesses 114 may be etched through the second ILD 110 using a first etching process; may be etched through the second CESL 108 using a second etching process; may be etched through the treated first ILD portion 106 and the first ILD 96 using a third etching process; and may be etched through the first CESL 94 using a fourth etching process. A mask, such as a photoresist, may be formed and patterned over the second ILD 110 to mask portions of the second ILD 110 from the etching processes used to form the recesses 114. In some embodiments, the etching process may over-etch and the recesses 114 may extend into the epitaxial source/drain regions 92. Bottom surfaces of the recesses 114 may be level with (e.g., at a same level, or having a same distance from the substrate 50), or lower than (e.g., closer to the substrate 50) top surfaces of the epitaxial source/drain regions 92.

After the recesses 114 are formed, silicide regions 112 are formed over the epitaxial source/drain regions 92. In some embodiments, the silicide regions 112 are formed by depositing a metal (not separately illustrated) capable of reacting with the semiconductor materials of the underlying epitaxial source/drain regions 92 (e.g., silicon, silicon germanium, germanium, or the like) to form silicide or germanide regions. The metal may include nickel, cobalt, titanium, tantalum, platinum, tungsten, other noble metals, other refractory metals, rare earth metals or their alloys. The metal is deposited over the exposed portions of the epitaxial source/drain regions 92, then a thermal anneal process is performed to form the silicide regions 112. The un-reacted portions of the deposited metal are removed, for example, by an etching process. Although the silicide regions 112 are referred to as silicide regions, the silicide regions 112 may also be germanide regions, or silicon germanide regions (e.g., regions comprising silicide and germanide).

Figure 17C:
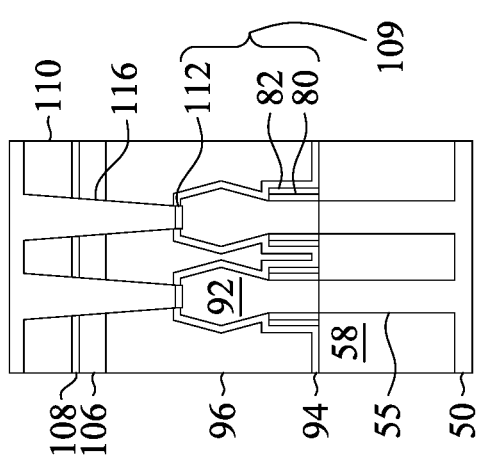
Figure 17B:
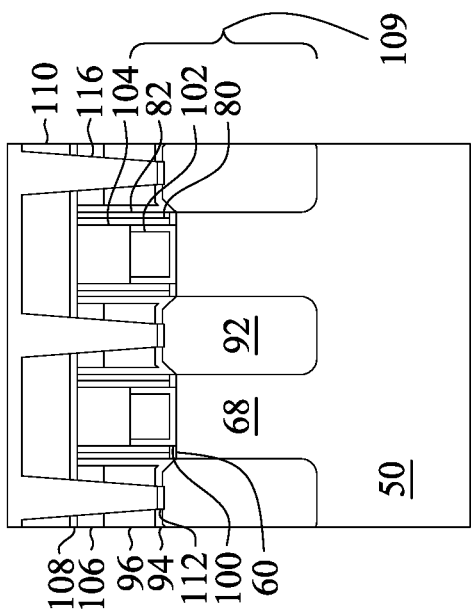
Figure 17A:
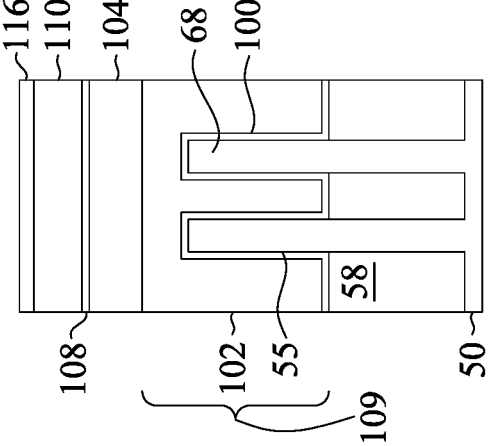

In FIGS. 17A through 17C, the recesses 114 are filled with a conductive material 116. The conductive material 116 may be subsequently patterned to form contacts, which are electrically coupled to the epitaxial source/drain regions 92 through the silicide regions 112. A liner (not separately illustrated), such as a diffusion barrier layer, an adhesion layer, or the like, may be deposited in the recesses 114 and the conductive material 116 may be deposited over the liner. The liner may include titanium, titanium nitride, tantalum, tantalum nitride, or the like. The conductive material 116 may be copper, a copper alloy, silver, gold, tungsten, ruthenium, cobalt, aluminum, nickel, or the like. The conductive material 116 may extend over top surfaces of the second ILD 110. The conductive material 116 may be formed by CVD, PVD, electroless plating, the like, or a combination thereof.

Figure 18C:
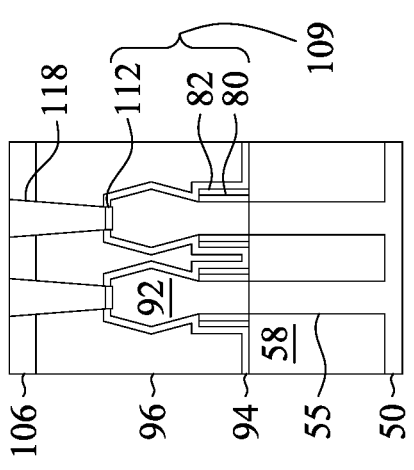
Figure 18B:
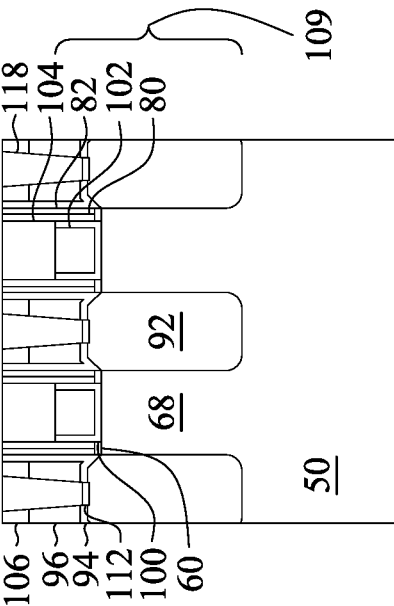
Figure 18A:
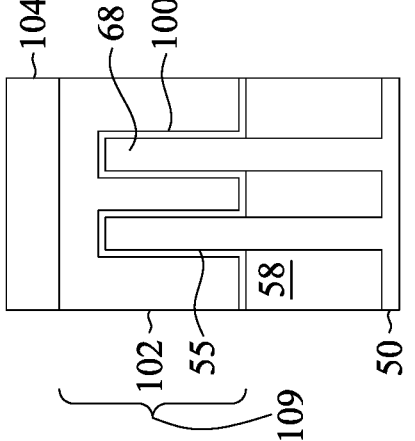

In FIGS. 18A through 18C, the conductive material 116 is planarized to form first source/drain contacts 118. Top portions of the conductive material 116 may be removed by a planarization process, such as a CMP. The first source/drain contacts 118 are physically and electrically coupled to the silicide regions 112 and are electrically coupled to the epitaxial source/drain regions 92 through the silicide regions 112. In some embodiments, the planarization process may remove at least portions of the second ILD 110 and the second CESL 108. For example, as illustrated in FIGS. 18A through 18C, the second ILD 110 and the second CESL 108 may be removed. In embodiments in which the second ILD 110 and the second CESL 108 remain, a nitridation process and/or a densification process the same as or similar to the processes discussed above with respect to FIGS. 14A through 14C may be performed on the second ILD 110.

Figure 19C:
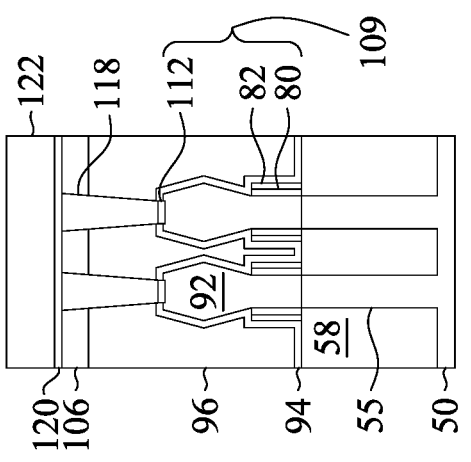
Figure 19B:
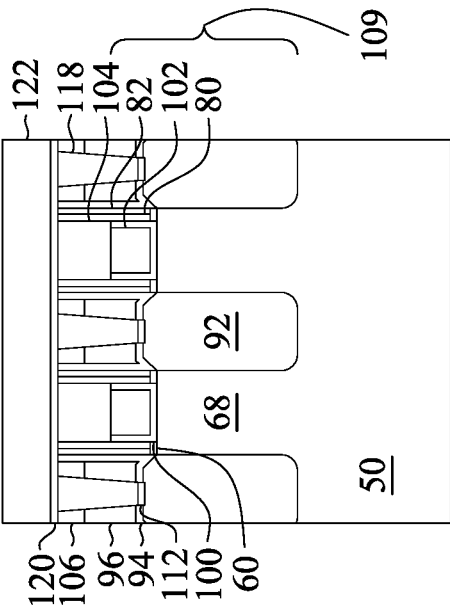
Figure 19A:
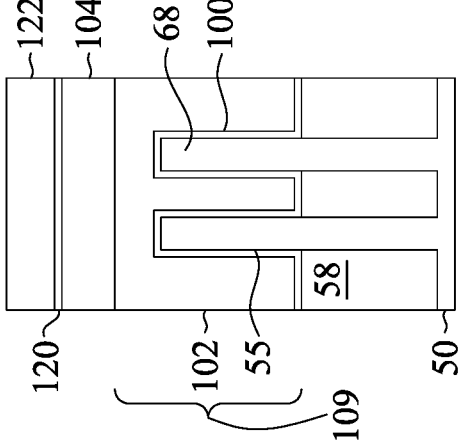

In FIGS. 19A through 19C, a third contact etch stop layer (CESL) 120 and a third interlayer dielectric (ILD) 122 are deposited over the structure illustrated in FIGS. 19A through 19C. The third ILD 122 may be referred to as ILD2. The third CESL 120 may be formed of materials and by processes the same as or similar to the first CESL 94. The third ILD 122 may be formed of materials and by processes the same as or similar to the first ILD 96.

Figure 20C:
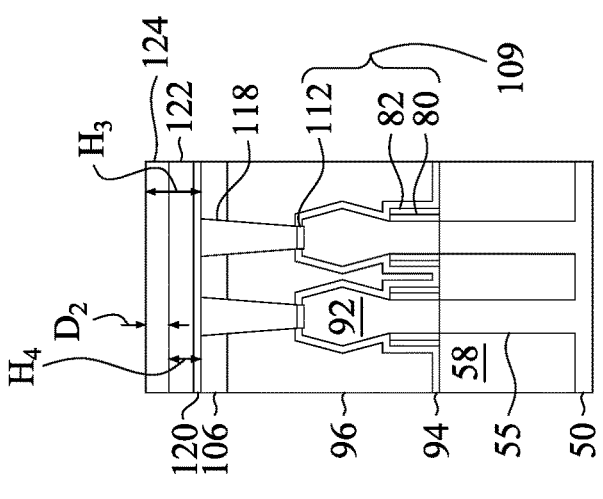
Figure 20B:
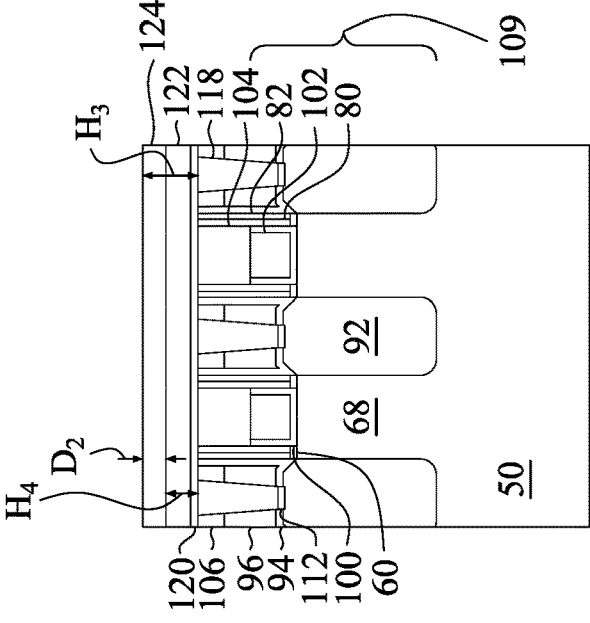
Figure 20A:
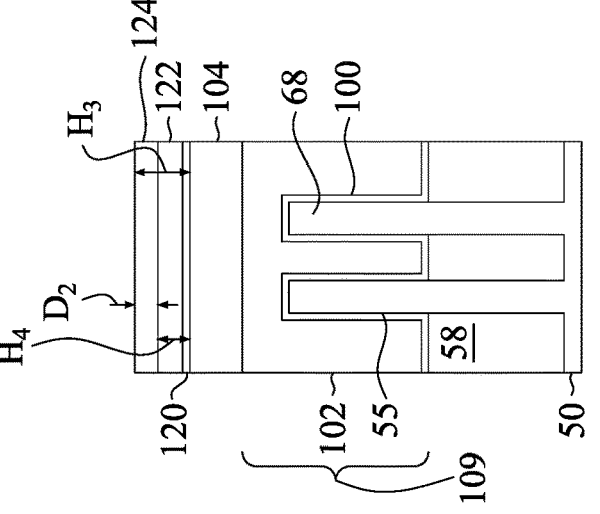

In FIGS. 20A through 20C, a nitridation process and/or a densification process is performed on the third ILD 122 to form a treated third ILD portion 124. The nitridation process and/or densification process may be the same as or similar to the nitridation processes and densification processes discussed above with respect to FIGS. 14A through 14C. As such, the nitrogen concentrations, densities, and hydrogen concentrations of the third ILD 122 and the treated third ILD portion 124 are the same as or similar to those discussed above for the first ILD 96 and the treated first ILD portion 106, respectively. Performing the nitridation process and/or the densification process on the third ILD 122 to form the treated third ILD portion 124 improves the etch resistance of the treated third ILD portion 124, which protects the treated third ILD portion 124 from damage caused by subsequent processing. For example, contacts may be subsequently formed in the treated third ILD portion 124 and the third ILD 122 and additional contacts may be subsequently formed over the treated third ILD portion 124. Forming the treated third ILD portion 124 reduces an etch rate of the treated third ILD portion 124 with respect to etchants used to form openings in which the contacts are formed, which reduces damage to the treated third ILD portion 124 and prevents materials of the contacts from being extruded into the treated third ILD portion 124. This prevents shorts between adjacent source/drain contacts, and reduces device defects.

Prior to performing the nitridation process and/or the densification process, the third ILD 122 may have a height $H_3$ over the gate capping layers 104 and the treated first ILD portion 106 in a range from about 10 nm to about 30 nm. In some embodiments, the treated third ILD portion 124 extends to a depth $D_2$ in a range from about 2 nm to about 15 nm. A ratio of the depth $D_2$ to the height $H_3$ may be in a range from about 0.07 to about 1. Portions of the third ILD 122 over the gate capping layers 104 and the first treated ILD portion 106 that are not treated by the nitridation process and/or the densification process have heights $H_4$ in a range from about 8 nm to about 28 nm. In some embodiments, the nitridation process and/or the densification process may be performed throughout the thickness of the third ILD 122. Providing the third ILD 122 and the treated third ILD portion 124 with the prescribed heights provides the benefits of the nitridation process and/or the densification process, without damaging structures underlying the third ILD 122.

Figure 21C:
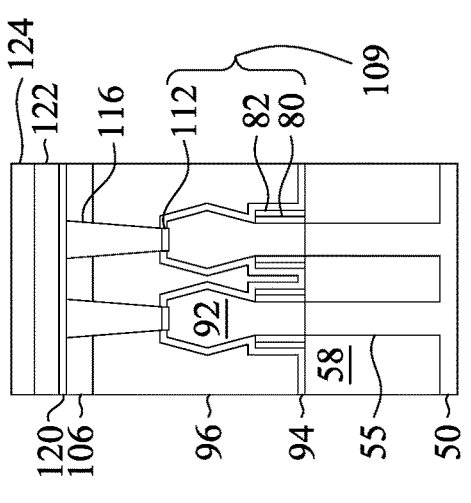
Figure 21B:
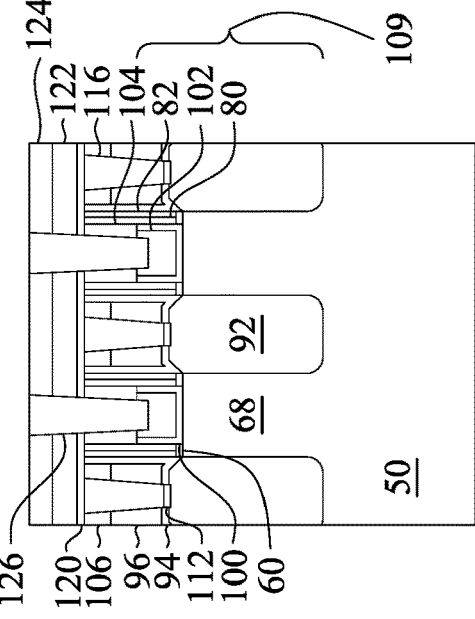
Figure 21A:
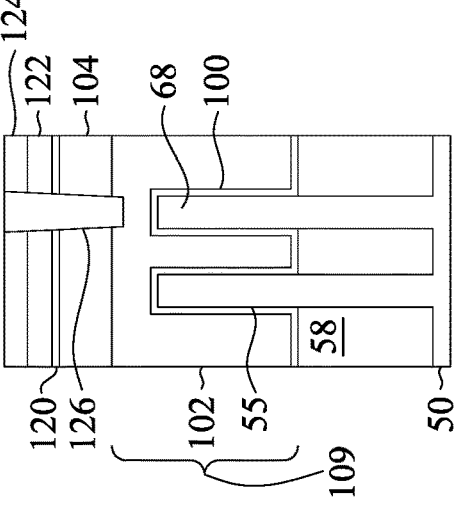

In FIGS. 21A through 21C, gate contacts 126 are formed. The gate contacts 126 may be formed through the treated third ILD portion 124, the third ILD 122, the third CESL 120, and the gate capping layers 104, and may be physically and electrically coupled to the gate electrodes 102. The gate contacts 126 are formed by forming openings through the treated third ILD portion 124, the third ILD 122, the third CESL 120, and the gate capping layers 104. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, ruthenium, cobalt, aluminum, nickel, or the like. A planarization process, such as a CMP, may be performed to remove excess material from over surfaces of the treated third ILD portion 124. The remaining portions of the liner and the conductive material form the gate contacts 126 in the openings. As illustrated in FIGS. 21A through 21C, in some embodiments, the etching process used to form the openings may over-etch, and the gate contacts 126 may extend at least partially into the gate electrodes 102.

Figure 22C:
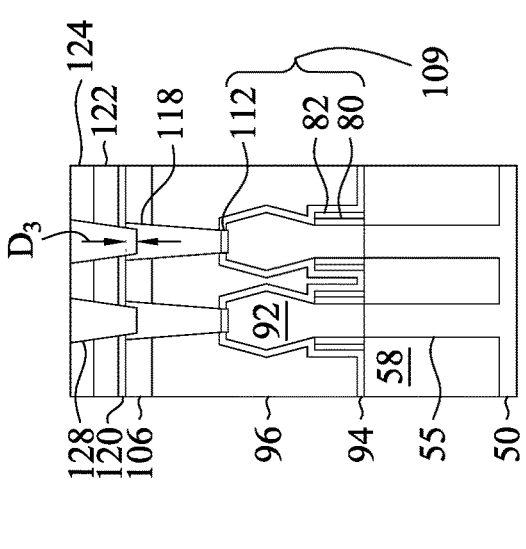
Figure 22B:
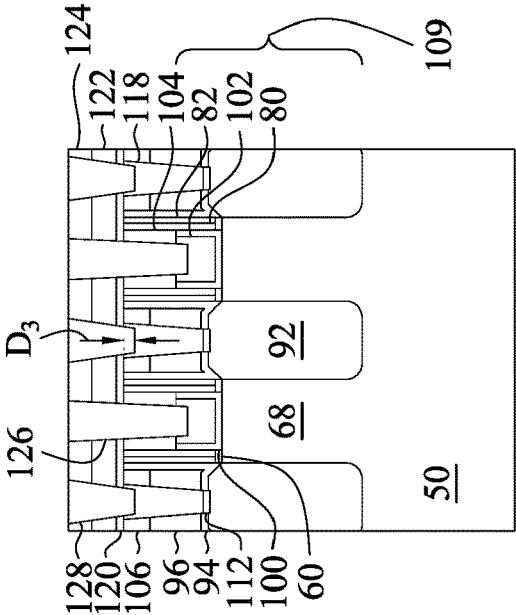
Figure 22A:
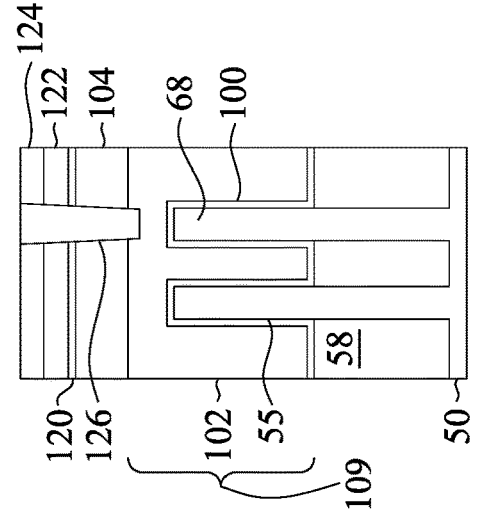

In FIGS. 22A through 22C, second source/drain contacts 128 are formed. The second source/drain contacts 128 may be formed through the treated third ILD portion 124, the third ILD 122, and the third CESL 120, and may be physically and electrically coupled to the first source/drain contacts 118. The second source/drain contacts 128 are formed by forming openings through the treated third ILD portion 124, the third ILD 122, and the third CESL 120. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, ruthenium, cobalt, aluminum, nickel, or the like. A planarization process, such as a CMP, may be performed to remove excess material from over surfaces of the treated third ILD portion 124. The remaining portions of the liner and the conductive material form the second source/drain contacts 128 in the openings.

As illustrated in FIGS. 22A through 22C, in some embodiments, the etching process used to form the openings may over-etch, and the second source/drain contacts 128 may extend into the first source/drain contacts 118 a distance $D_3$, which may be in a range from about 0 nm to about 5 nm. Although the second source/drain contacts 128 are illustrated as being aligned with centers of the first source/drain contacts 118, the second source/drain contacts 128 may be misaligned, or may have widths greater than widths of the first source/drain contacts 118, such that the etch processes used to form the openings in which the second source/drain contacts 128 are formed may at least partially expose the treated first ILD portion 106. Performing the nitridation process and/or the densification process on the first ILD 96 to form the treated first ILD portion 106 provides the treated first ILD portion 106 with a lower etch rate. This prevents the treated first ILD portion 106 from being damaged by etch processes used to form the openings in which the second source/drain contacts 128 are formed. Etching the first ILD 96 may cause materials of the second source/drain contacts 128 to extrude towards one another, and may result in shorts being formed between the second source/drain contacts 128. Accordingly, forming the treated first ILD portion 106 reduces damage to the first ILD 96, prevents shorts between the second source/drain contacts 128, and reduces device defects.

In some embodiments, pre-clean processes and the like may be performed after forming the openings and prior to forming the second source/drain contacts 128 in the openings. Forming the treated first ILD portion 106 may further reduce damage to the first ILD 96, which may occur as a result of the pre-clean processes and other processes.

Figure 23C:
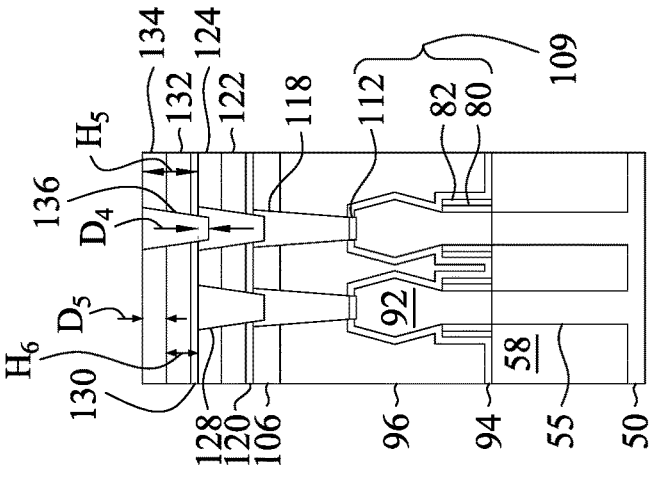
Figure 23B:
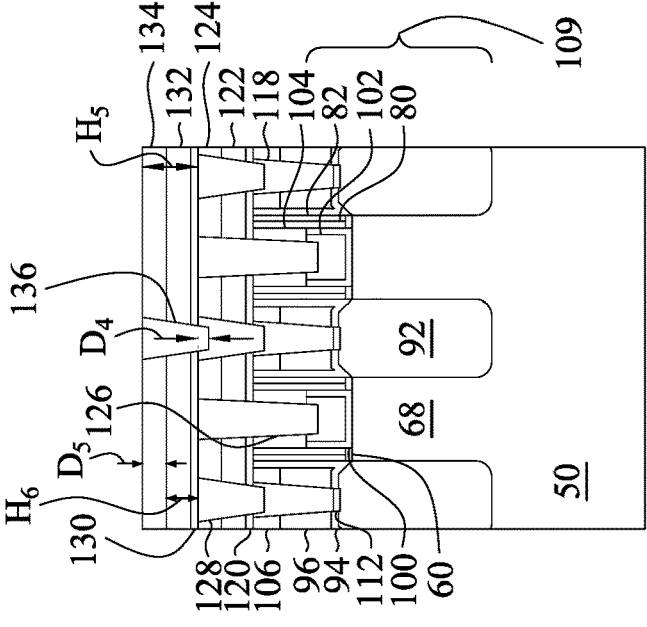
Figure 23A:
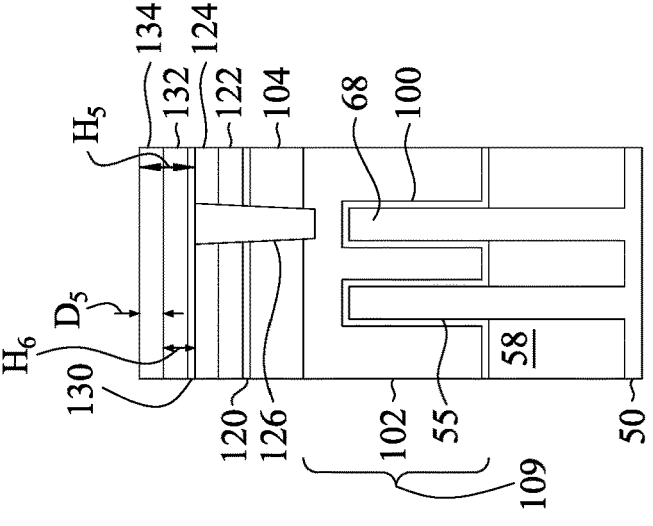

In FIGS. 23A through 23C, a fourth contact etch stop layer (CESL) 130 and a first inter-metal dielectric (IMD) 132 are deposited over the structure illustrated in FIGS. 22A through 22C, a nitridation process and/or a densification process is performed on the first IMD 132 to form a treated first IMD portion 134, and metal lines 136 are formed. The fourth CESL 130 may be formed of materials and by processes the same as or similar to the first CESL 94. The first IMD 132 may be formed of materials and by processes the same as or similar to the first ILD 96.

The nitridation process and/or densification process performed on the first IMD 132 may be the same as or similar to the nitridation processes and densification processes discussed above with respect to FIGS. 14A through 14C. As such, the nitrogen concentrations, densities, and hydrogen concentrations of the first IMD 132 and the treated first IMD portion 134 are the same as or similar to those discussed above for the first ILD 96 and the treated first ILD portion 106, respectively. Performing the nitridation process and/or the densification process on the first IMD 132 to form the treated first IMD portion 134 improves the etch resistance of the treated first IMD portion 134, which protects the treated first IMD portion 134 from damage caused by subsequent processing. For example, contacts may be subsequently formed in the treated first IMD portion 134 and the first IMD 132 and additional contacts may be subsequently formed over the treated first IMD portion 134. Forming the treated first IMD portion 134 reduces an etch rate of the treated first IMD portion 134 with respect to etchants used to form openings in which the contacts are formed, which reduces damage to the treated first IMD portion 134 and prevents materials of the contacts from being extruded into the treated first IMD portion 134. This prevents shorts between adjacent source/drain contacts, and reduces device defects.

Prior to performing the nitridation process and/or the densification process, the first IMD 132 may have a height $H_5$ over the treated third ILD portion 124 in a range from about 10 nm to about 30 nm. In some embodiments, the treated first IMD portion 134 extends to a depth $D_5$ in a range from about 2 nm to about 28 nm. A ratio of the depth $D_5$ to the height $H_5$ may be in a range from about 0.07 to about 1. Portions of the first IMD 132 over the treated third ILD portion 124 that are not treated by the nitridation process and/or the densification process have heights $H_6$ in a range from about 8 nm to about 28 nm. In some embodiments, the nitridation process and/or the densification process may be performed throughout the thickness of the first IMD 132. Providing the first IMD 132 and the treated first IMD portion 134 with the prescribed heights provides the benefits of the nitridation process and/or the densification process, without damaging structures underlying the first IMD 132.

The metal lines 136 may be formed through the treated first IMD portion 134, the first IMD 132, and the fourth CESL 130, and may be physically and electrically coupled to the second source/drain contacts 128 and/or the gate contacts 126. The metal lines 136 are formed by forming openings through the treated first IMD portion 134, the first IMD 132, and the fourth CESL 130. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, ruthenium, cobalt, aluminum, nickel, or the like. A planarization process, such as a CMP, may be performed to remove excess material from over surfaces of the treated first IMD portion 134. The remaining portions of the liner and the conductive material form the metal lines 136 in the openings.

As illustrated in FIGS. 23A through 23C, in some embodiments, the etching process used to form the openings may over-etch, and the metal lines 136 may extend into the second source/drain contacts 128 and/or the gate contacts 126 a distance $D_4$, which may be in a range from about 0 nm to about 5 nm. Although the metal lines 136 are illustrated as being aligned with centers of the second source/drain contacts 128, the metal lines 136 may be misaligned, or may have widths greater than widths of the second source/drain contacts 128, such that the etch processes used to form the openings in which the metal lines 136 are formed may at least partially expose the treated third ILD portion 124. Performing the nitridation process and/or the densification process on the third ILD 122 to form the treated third ILD portion 124 provides the treated third ILD portion 124 with a lower etch rate. This prevents the treated third ILD portion 124 from being damaged by etch processes used to form the openings in which the metal lines 136 are formed. Etching the third ILD 122 may cause materials of the metal lines 136 to extrude towards one another, and may result in shorts being formed between the metal lines 136. Accordingly, forming the treated third ILD portion 124 reduces damage to the third ILD 122, prevents shorts between the metal lines 136, and reduces device defects.

In some embodiments, pre-clean processes and the like may be performed after forming the openings and prior to forming the metal lines 136 in the openings. Forming the treated third ILD portion 124 may further reduce damage to the third ILD 122, which may occur as a result of the pre-clean processes and other processes.

Embodiments may achieve advantages. For example, performing the above-described nitridation processes and/or densification processes on various dielectric layers increases the etch-resistance of the treated dielectric layers. This reduces undesired etching of the dielectric layers, prevents conductive materials from being deposited in the dielectric layers, prevents extrusion of the conductive materials through the dielectric layers, and prevents shorts from being formed between contacts in semiconductor devices. This reduces device defects.

The disclosed FinFET embodiments could also be applied to nanostructure devices such as nanostructure (e.g., nanosheet, nanowire, gate-all-around, or the like) field effect transistors (NSFETs). In an NSFET embodiment, the fins are replaced by nanostructures formed by patterning a stack of alternating layers of channel layers and sacrificial layers. Dummy gate stacks and source/drain regions are formed in a manner similar to the above-described embodiments. After the dummy gate stacks are removed, the sacrificial layers can be partially or fully removed in channel regions. The replacement gate structures are formed in a manner similar to the above-described embodiments, the replacement gate structures may partially or completely fill openings left by removing the sacrificial layers, and the replacement gate structures may partially or completely surround the channel layers in the channel regions of the NSFET devices. ILDs and contacts to the replacement gate structures and the source/drain regions may be formed in a manner similar to the above-described embodiments. A nanostructure device can be formed as disclosed in U.S. Pat. No. 9,647,071, which is incorporated herein by reference in its entirety.

In accordance with an embodiment, a semiconductor device includes a transistor structure on a semiconductor substrate; a first dielectric layer on the transistor structure; a second dielectric layer on the first dielectric layer, the second dielectric layer having a second nitrogen concentration greater than a first nitrogen concentration of the first dielectric layer; a first conductive structure extending through the second dielectric layer and the first dielectric layer, the first conductive structure being electrically coupled to a first source/drain region of the transistor structure, a top surface of the first conductive structure being level with a top surface of the second dielectric layer; and a second conductive structure physically and electrically coupled to the first conductive structure, a bottom surface of the second conductive structure being a first distance below the top surface of the second dielectric layer. In an embodiment, the semiconductor device further includes a first etch stop layer between the first dielectric layer and the transistor structure, the first conductive structure extending through the first etch stop layer. In an embodiment, the second nitrogen concentration is in a range from 5 atomic percent to 15 atomic percent. In an embodiment, the first dielectric layer and the second dielectric layer include silicon oxide. In an embodiment, the first distance is in a range from 0 nm to 5 nm. In an embodiment, the second dielectric layer has a thickness in a range from 2 nm to 15 nm. In an embodiment, a thickness of the first dielectric layer over a top surface of the first source/drain region is from 0 nm to 28 nm.

In accordance with another embodiment, a method includes forming a transistor structure; forming a first dielectric layer over the transistor structure; and performing a densification process on the first dielectric layer, the densification process forming a denser region in a top portion of the first dielectric layer and a less dense region in a bottom portion of the first dielectric layer, the denser region having a thickness in a range from 2 nm to 15 nm. In an embodiment, performing the densification process includes performing an ultra-violet radiation treatment on the first dielectric layer. In an embodiment, performing the densification process includes exposing the first dielectric layer to a hydrogen plasma. In an embodiment, the hydrogen plasma is generated with an RF power in a range from 50 W to 2000 W. In an embodiment, a ratio of a first density of the denser region to a second density of the less dense region is from 1.02 to 1.05. In an embodiment, the first dielectric layer is formed over a source/drain region of the transistor structure, and a bottom surface of the denser region is separated from the source/drain region by a portion of the less dense region having a positive thickness after performing the densification process. In an embodiment, the method further includes forming a first conductive structure extending through the denser region and the less dense region of the first dielectric layer; and forming a second conductive structure on the first conductive structure, the second conductive structure being physically and electrically coupled to the first conductive structure, and a bottom surface of the second conductive structure being vertically between a top surface of the first conductive structure and a bottom surface of the denser region of the first dielectric layer.

In accordance with yet another embodiment, a method of manufacturing a semiconductor device includes forming a first conductive structure in a first dielectric layer; performing a nitridation treatment on the first dielectric layer to form a treated region and an untreated region in the first dielectric layer, the treated region having a first thickness in a range from 2 nm to 15 nm from a top surface of the first dielectric layer; forming a first etch stop layer on the first dielectric layer; forming a second dielectric layer on the first etch stop layer; and forming a second conductive structure in the second dielectric layer and the first etch stop layer, the second conductive structure being coupled with the first conductive structure. In an embodiment, the treated region has a nitrogen concentration in a first range from 5 atomic percent to 15 atomic percent, and the untreated region has a second nitrogen concentration of less than 2 atomic percent. In an embodiment, the nitridation treatment includes a nitrogen soak. In an embodiment, the nitridation treatment includes exposing the first dielectric layer to a nitrogen plasma. In an embodiment, the nitrogen plasma is generated with an RF power in a range from 50 W to 2000 W. In an embodiment, forming the second conductive structure includes forming an opening extending through the second dielectric layer, the first etch stop layer, and into the first conductive structure, a bottom surface of the opening being below a top surface of the first dielectric layer and above a bottom surface of the treated region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming a transistor structure comprising a source/drain region;

forming a first dielectric layer over the transistor structure; and performing a densification process on the first dielectric layer, wherein the densification process forms a denser region in a top portion of the first dielectric layer and a less dense region in a bottom portion of the first dielectric layer, the denser region having a thickness in a range from 2 nm to 15 nm, wherein the first dielectric layer is formed over the source/drain region of the transistor structure, and wherein a bottom surface of the denser region is separated from the source/drain region by a portion of the less dense region after performing the densification process.

2. The method of claim 1, wherein performing the densification process comprises performing an ultra-violet radiation treatment on the first dielectric layer.

3. The method of claim 1, wherein performing the densification process comprises exposing the first dielectric layer to a hydrogen plasma.

4. The method of claim 3, wherein the hydrogen plasma is generated with an RF power in a range from 50 W to 2000 W.

5. The method of claim 1, wherein a ratio of a first density of the denser region to a second density of the less dense region is from 1.02 to 1.05.

6. The method of claim 1, wherein the transistor structure comprises a gate structure, and wherein the portion of the less dense region extends along sidewalls of the gate structure.

7. The method of claim 1, further comprising:

forming a first conductive structure extending through the denser region and the less dense region of the first dielectric layer; and forming a second conductive structure on the first conductive structure, wherein the second conductive structure is physically and electrically coupled to the first conductive structure, and wherein a bottom surface of the second conductive structure is vertically between a top surface of the first conductive structure and a bottom surface of the denser region of the first dielectric layer.

8. A method of manufacturing a semiconductor device comprising:

forming a first conductive structure in a first dielectric layer;

performing a nitridation treatment on the first dielectric layer to form a treated region and an untreated region in the first dielectric layer, wherein the treated region has a first thickness in a range from 2 nm to 15 nm from a top surface of the first dielectric layer;

forming a first etch stop layer on the first dielectric layer;

forming a second dielectric layer on the first etch stop layer; and forming a second conductive structure in the second dielectric layer and the first etch stop layer, wherein the second conductive structure is coupled with the first conductive structure.

9. The method of claim 8, wherein the treated region has a nitrogen concentration in a first range from 5 atomic percent to 15 atomic percent, and wherein the untreated region has a second nitrogen concentration of less than 2 atomic percent.

10. The method of claim 8, wherein the nitridation treatment comprises a nitrogen soak.

11. The method of claim 8, wherein the nitridation treatment comprises exposing the first dielectric layer to a nitrogen plasma.

12. The method of claim 11, wherein the nitrogen plasma is generated with an RF power in a range from 50 W to 2000 W.

13. The method of claim 8, wherein forming the second conductive structure comprises forming an opening extending through the second dielectric layer, the first etch stop layer, and into the first conductive structure, wherein a bottom surface of the opening is below a top surface of the first dielectric layer and above a bottom surface of the treated region.

14. A method of manufacturing a semiconductor device, the method comprising:

performing a nitridation treatment on a first dielectric layer to treat an upper region of the first dielectric layer, wherein the upper region has a first thickness in a range from 2 nm to 15 nm from a top surface of the first dielectric layer, wherein after the nitridation treatment, the upper region has a higher concentration of nitrogen than a lower region of the first dielectric layer, and wherein the first dielectric layer has a first conductive feature disposed therein;

depositing a first etch stop layer on the first dielectric layer;

depositing a second dielectric layer on the first etch stop layer; and forming a second conductive feature in the second dielectric layer and the first etch stop layer, wherein the second conductive feature is coupled with the first conductive feature.

15. The method of claim 14, wherein after the nitridation treatment, the upper region has a nitrogen concentration in a first range from 5 atomic percent to 15 atomic percent, and the lower region has a second nitrogen concentration of less than 2 atomic percent.

16. The method of claim 14, wherein the nitridation treatment comprises a nitrogen soak.

17. The method of claim 14, wherein the nitridation treatment comprises exposing the first dielectric layer to a nitrogen plasma.

18. The method of claim 14, wherein forming the second conductive feature comprises forming an opening extending through the second dielectric layer, the first etch stop layer, and into the first conductive feature, wherein a bottom surface of the opening is below a top surface of the first dielectric layer and above a bottom of the upper region.

19. The method of claim 14, wherein the first conductive feature is a gate structure, and wherein the second conductive feature is a gate contact.

20. The method of claim 14, wherein the first conductive feature is a gate contact electrically coupled to a gate stack.

* * * * *